(12) United States Patent
Yamada et al.

(10) Patent No.: US 11,450,790 B2
(45) Date of Patent: Sep. 20, 2022

(54) LIGHT EMITTING DEVICE

(71) Applicant: NICHIA CORPORATION, Anan (JP)

(72) Inventors: Chihiro Yamada, Anan (JP); Daisuke Iwakura, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 201 days.

(21) Appl. No.: 16/833,552

(22) Filed: Mar. 28, 2020

(65) Prior Publication Data

US 2020/0313047 A1 Oct. 1, 2020

(30) Foreign Application Priority Data

Mar. 29, 2019 (JP) .............................. JP2019-068534
Mar. 19, 2020 (JP) .............................. JP2020-049075

(51) Int. Cl.
*H01L 33/50* (2010.01)
*H01L 33/62* (2010.01)
(Continued)

(52) U.S. Cl.
CPC ........ *H01L 33/504* (2013.01); *C09K 11/0883* (2013.01); *C09K 11/665* (2013.01); *C09K 11/7734* (2013.01); *H01L 33/32* (2013.01); *H01L 33/486* (2013.01); *H01L 33/505* (2013.01); *H01L 33/507* (2013.01); *H01L 33/56* (2013.01); *H01L 33/60* (2013.01); *H01L 33/62* (2013.01); *H01L 2933/005* (2013.01); *H01L 2933/0041* (2013.01); *H01L 2933/0066* (2013.01)

(58) Field of Classification Search
CPC ..... H01L 33/504; H01L 33/507; H01L 33/56; H01L 33/60; C09K 11/0883; C09K 11/665; C09K 11/7734
See application file for complete search history.

(56) References Cited

U.S. PATENT DOCUMENTS 8,890,403 B2  11/2014  Sakuta et al.
9,564,557 B2   2/2017  Weiler et al.
(Continued)

FOREIGN PATENT DOCUMENTS

JP   2012104814 A   5/2012
JP   2016503579 A   5/2014
(Continued)

*Primary Examiner* — Mark W Tornow
(74) *Attorney, Agent, or Firm* — Hunton Andrews Kurth LLP

(57) ABSTRACT

The red light-emitting device includes a light source, a first layer covering at least a portion of the light source and containing a fluoride phosphor converting light emitted from the light source, and a second layer covering at least a portion of the first layer and containing a nitride phosphor converting light emitted from the light source and/or the first layer. An emission intensity ratio at an emission peak wavelength of the light source is greater than 0 and 0.1 or less, and the emission intensity ratio at the wavelength of the maximum emission peak in an emission spectrum of the light-emitting device is greater than 2.8, supposing the reference emission intensity that is the minimum emission intensity within the range of plus or minus 15 nm or 30 nm from the wavelength of the maximum emission peak in the emission spectrum of the light-emitting device is 1.

19 Claims, 17 Drawing Sheets

(51) Int. Cl.
  *H01L 33/60* (2010.01)
  *H01L 33/32* (2010.01)
  *H01L 33/48* (2010.01)
  *H01L 33/56* (2010.01)
  *C09K 11/66* (2006.01)
  *C09K 11/77* (2006.01)
  *C09K 11/08* (2006.01)

(56) References Cited

U.S. PATENT DOCUMENTS

| | | |
|---|---|---|
| 9,947,840 B2 | 4/2018 | Yuasa et al. |
| 10,158,052 B2 | 12/2018 | Weiler et al. |
| 10,468,564 B1 * | 11/2019 | Zhao ................ C09K 11/0883 |
| 10,546,981 B2 | 1/2020 | Yuasa |
| 2013/0264937 A1 * | 10/2013 | Sakuta ................ H01L 33/504 |
| | | 313/503 |
| 2015/0295144 A1 | 10/2015 | Weiler et al. |
| 2016/0372638 A1 | 12/2016 | Todorov et al. |
| 2017/0069801 A1 * | 3/2017 | Oka ...................... H01L 33/60 |
| 2017/0162758 A1 | 6/2017 | Weiler et al. |
| 2018/0006197 A1 | 1/2018 | Yuasa et al. |
| 2019/0035987 A1 | 1/2019 | Yuasa |

FOREIGN PATENT DOCUMENTS

| | | |
|---|---|---|
| JP | 2016092401 A | 5/2016 |
| JP | 2018006471 A | 1/2018 |
| JP | 2018107418 A | 7/2018 |
| JP | 2019029386 A | 2/2019 |

* cited by examiner

LIGHT EMITTING DEVICE

CROSS-REFERENCE TO RELATED APPLICATION

This application claims priority to Japanese Patent Application No. 2019-068534 filed on Mar. 29, 2019, and Japanese Patent Application No. 2020-49075 filed on Mar. 19, 2020, the disclosures of which are hereby incorporated by reference in their entireties.

BACKGROUND

The present disclosure relates to a light-emitting device.

Light-emitting devices that employ combinations of light-emitting diodes (hereinafter also referred to as "LEDs") and phosphors to emit white light have been developed. Such light-emitting devices provide desired emission colors such as white or red according to principles of mixing colors of light. These light-emitting devices are used widely in the fields of general lighting, lights for vehicles, displays, backlights for liquid crystal displays, and the like. Light-emitting devices that emit mixed light with high color purity are desired. A light-emitting device with a small full width at half maximum of an emission peak in its emission spectrum has been known. The full width at half maximum (FWHM) of the emission peak in the emission spectrum; that is, the width in terms of wavelengths of the emission peak at 50% of the maximum value of the emission peak in the emission spectrum.

For example, Japanese Patent Publication No. 2012-104814 discloses a light-emitting device including an LED element that emits blue light and a phosphor that emits yellow light and/or green light through wavelength conversion of light emitted from the LED element. The light-emitting device emits white light by mixing colors of light by employing a reduced amount of a manganese-activated fluoride phosphor with a small full width at half maximum as the phosphor.

SUMMARY

Certain embodiment of the present disclosure has an object to provide a light-emitting device that emits red light with a good luminous flux and color purity.

A first embodiment of the present disclosure is a red light-emitting device including a light source, a first layer, and a second layer. The first layer covers at least a portion of the light source and includes a fluoride phosphor for wavelength conversion of light emitted from the light source. The fluoride phosphor includes at least one of a manganese-activated fluoride complex phosphor and a manganese-activated fluorogermanate phosphor. The second layer covers at least a portion of the first layer and includes a nitride phosphor for wavelength conversion of light emitted from the light source and/or the first layer. In a case in which the fluoride complex phosphor is contained and the fluorogermanate phosphor is not contained, a first reference emission intensity is regarded as a minimum emission intensity in an emission spectrum in a range of 15 nm on both of a long wavelength side and a short wavelength side from a first center that is a wavelength of a first maximum emission peak in an emission spectrum of the light-emitting device. In a case in which the fluorogermanate phosphor is comprised, where a second reference emission intensity is regarded as a minimum emission intensity in an emission spectrum in a range of 30 nm on both of the long wavelength side and the short wavelength side from a second center that is a wavelength of a second maximum emission peak in the emission spectrum of the light-emitting device. Supposing both the first reference emission intensity and the second reference emission intensity are 1, an emission intensity ratio at an emission peak wavelength of the light source is greater than 0 and 0.1 or less, and an emission intensity ratio at the wavelength of the first maximum emission peak and/or an emission intensity ratio at the wavelength of the second maximum emission peak in the emission spectrum of the light-emitting device is greater than 2.8.

Certain embodiment of the present disclosure can provide a light-emitting device that emits red light with a good luminous flux and color purity.

EMBODIMENTS

A light-emitting device according to the present disclosure will be described below on the basis of an embodiment.

The embodiment below is an example for embodying the technical idea of the present invention and does not limit the present disclosure to the light-emitting device below. The relationships between color names and chromaticity coordinates, the relationships between wavelength ranges of light and color names of monochromatic lights, and the like are based on Japanese Industrial Standard (JIS) Z8110.

Figure 1A:
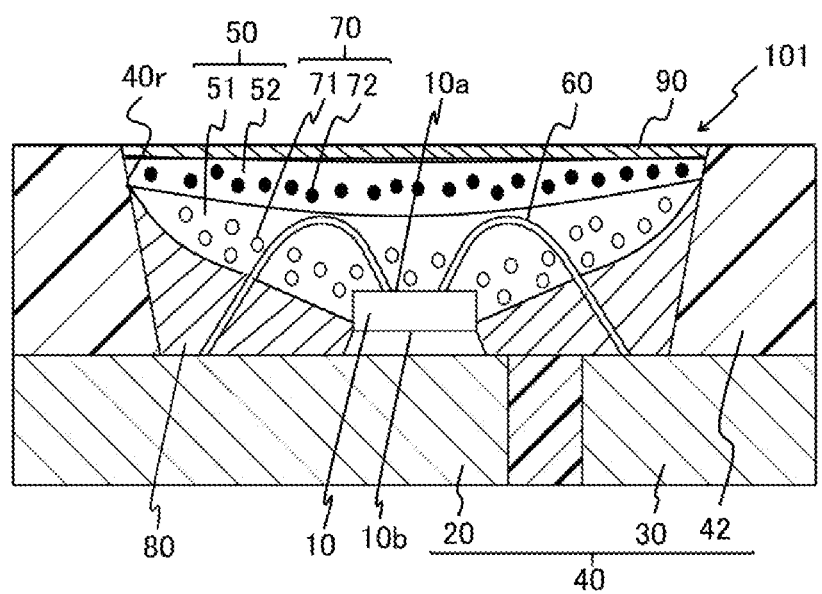
FIG. 1A is a schematic cross-sectional view illustrating a light-emitting device according to a first embodiment of the present disclosure.

An illustrative light-emitting device of an embodiment of the present disclosure will be described on the basis of the drawings. FIG. 1A is a schematic cross-sectional view illustrating a light-emitting device 101 according to a first embodiment of the present disclosure.

The light-emitting device 101 includes a light source 10, a first layer 51 covering at least a portion of the light source 10 and containing a fluoride phosphor 71 that performs wavelength conversion of light emitted from the light source 10, and a second layer 52 covering at least a portion of the first layer 51 and containing a nitride phosphor 72 that performs wavelength conversion of light emitted from the light source 10 and/or the first layer 51. The first layer 51 and the second layer 52 constitute a phosphor member 50.

The light-emitting device 101 includes a molded body 40. The molded body 40 is configured as integral molding of a first lead 20, a second lead 30, and a resin portion 42. The resin portion 42 contains a thermoplastic resin or a thermosetting resin, and constitutes a lateral wall of the molded body 40. The molded body 40 has a recess 40r having a bottom surface and at least one lateral surface. The light source 10 is placed on the bottom surface of the recess 40r. The light source 10 is preferably a light-emitting element. The light source 10 includes a pair of positive and negative electrodes electrically connected respectively to the first lead 20 and the second lead 30 by wires 60. The light-emitting device 101 can emit light by receiving electricity supplied from an external device through the first lead 20 and the second lead 30.

Light Source

The light source 10 is preferably a semiconductor light-emitting element, more preferably a GaN semiconductor light-emitting element. Using a GaN semiconductor light-emitting element as the light source can achieve a high-efficiency light-emitting device that has high linearity relative to input current and is resistant to mechanical shock. For example, a GaN semiconductor light-emitting element employing a nitride semiconductor ($In_xAl_yGa_{1-X-Y}N$, where $0 \leq X$, $0 \leq Y$, and $X+Y \leq 1$) can be used.

The emission peak wavelength of the light source 10 is in the range of preferably 400 nm or greater and 480 nm or less, more preferably 420 nm or greater and 460 nm or less.

In the case in which the light source 10 is configured as a light-emitting element, a second surface 10b opposite to a first surface 10a on which the pair of electrodes have been formed is placed on the first lead 20 constituting the bottom surface of the recess 40r, and the first surface 10a of the light source 10 on which the pair of electrodes have been formed serves as the main light-extracting surface if the light source 10 is mounted with the electrode surface facing up.

First Layer

The first layer 51 covers at least a portion of the light source 10 and constitutes the phosphor member 50 together with the second layer 52. The first layer 51 preferably contains a resin or glass and the fluoride phosphor 71 that performs wavelength conversion of light emitted from the light source 10. The first layer 51 can contain another phosphor that performs wavelength conversion of light emitted from the light source 10 to emit red light, in addition to the fluoride phosphor 71. The first layer 51 covers at least a portion of the light-extracting surface of the light source 10. The first layer 51 can cover the entire light-extracting surface of the light source 10 or a portion of the light-extracting surface of the light source 10. The first layer 51 is preferably in contact with at least a portion of the light source 10. If the first layer 51 is in contact with at least a portion of the light source 10, light emitted from the light source 10 is more likely to be absorbed and efficiently subjected to wavelength conversion than in the case in which the first layer 51 is spaced apart from the light source 10, so that red light with an improved luminous flux is obtained. The fluoride phosphor 71 contained in the first layer 51 contains at least one of a fluoride complex phosphor activated with manganese (also referred to as "Mn-activated fluoride complex phosphor") and a fluorogermanate phosphor activated with manganese (also referred to as "Mn-activated MGF phosphor"). There is a case in which the first layer 51 contains the Mn-activated fluoride complex phosphor and does not contain the Mn-activated MGF phosphor. There is a case in which the first layer 51 does not contain the Mn-activated fluoride complex phosphor and contains the Mn-activated MGF phosphor. There is a case where the first layer 51 contains both the Mn-activated fluoride complex phosphor and the Mn-activated MGF phosphor.

Fluoride Phosphor

The first layer containing a fluoride phosphor that contains at least one of the Mn-activated fluoride complex phosphor and the Mn-activated MGF phosphor may enhance the luminous flux of the phosphor emitting red light.

Mn-Activated Fluoride Complex Phosphor

The Mn-activated fluoride complex phosphor can be one that contains: at least one selected from the group consisting of the alkali-metal elements and $NH_4^+$; and at least one element selected from the group consisting of the group IV elements and the group XIV elements, in its composition. The Mn-activated fluoride complex phosphor absorbs light emitted from the light source having an emission peak wavelength within the range of, for example, 400 nm or greater and 480 nm or less, and preferably emits light having a peak wavelength within the range of 610 nm or greater and 650 nm or less, and more preferably emits light having a peak wavelength within the range of 615 nm or greater and less than 645 nm. The Mn-activated fluoride complex phosphor has a comparatively small full width at half maximum. The full width at half maximum in the emission spectrum of the Mn-activated fluoride complex phosphor is specifically 20 nm or less, preferably 10 nm or less, more preferably 5 nm or less. The emission spectrum of the Mn-activated fluoride complex phosphor can show a plurality of peaks within the range of 610 nm or greater and 650 nm or less. The first layer containing the Mn-activated fluoride complex phosphor may enhance the luminous flux of the light-emitting device that emits red light.

The Mn-activated fluoride complex phosphor preferably has the composition represented by Formula (I) below.

$$A_2[M^a{}_{1-a}Mn^{4+}{}_aF_6] \tag{I}$$

(In Formula (I), "A" is at least one selected from the group consisting of the alkali-metal elements and $NH_4^+$, $M^a$ is at least one element selected from the group consisting of the group 4 elements and the group 14 elements, and "a" satisfies $0 < a < 0.2$.)

The Mn-activated fluoride complex phosphor is preferably particles. In the case in which the Mn-activated fluoride complex phosphor is particles, the average particle diameter of the Mn-activated fluoride complex phosphor particles is preferably in a range of 10 μm or greater and 90 μm or less, more preferably in a range of 15 μm or greater and 70 μm or less, and further preferably in a range of 20 μm or greater and 60 μm or less. The average particle diameter of the particles of the phosphor can be measured by the Fisher sub-sieve sizer method (also referred to as "FSSS method"). The FSSS method is a kind of the air permeability method, in which the specific surface area is measured by utilizing the flow resistance of air, and the particle diameter of primary particles is mainly obtained. The average particle diameter measured by the FSSS method is the Fisher sub-sieve sizer's number. In the case in which the Mn-activated fluoride complex phosphor is particles, and the average particle diameter measured by the FSSS method is in a range of 10 μm or greater and 90 μm or less, the light from the light source can be efficiently subjected to wavelength conversion, and red light can be emitted efficiently. In the case in which the Mn-activated fluoride complex phosphor is particles, and the average particle diameter is less than 10 μm, the light from the light source cannot be efficiently subjected to wavelength conversion in some cases. In the case in which the Mn-activated fluoride complex phosphor is particles, and the average particle diameter exceeds 90 μm, the handling thereof in the formation of the first layer becomes difficult in some cases, and the disposition of the Mn-activated fluoride complex phosphor inside the first layer becomes uneven in some cases.

In the case in which the fluoride phosphor is configured as particles, and the nitride phosphor contained in the second layer is configured as particles, the average particle diameter of the fluoride phosphor particles contained in the first layer is preferably larger than the average particle diameter of the nitride phosphor particles. In the case in which the average particle diameter of the fluoride phosphor particles contained in the first layer is larger than the average particle diameter of the nitride phosphor particles contained in the second layer, in the light-emitting element as the light source, the first layer, and the second layer, which are disposed perpendicular to the gravitational direction, the fluoride phosphor in the first layer is likely to be disposed predominantly close to the light-emitting element through natural sedimentation or centrifugal sedimentation, and also the nitride phosphor in the second layer is likely to be disposed predominantly close to the light-emitting element and the first layer.

Mn-Activated MGF Phosphor

The Mn-activated MGF phosphor contains magnesium oxide, an oxide containing at least one element selected from the group consisting of the alkali-metal elements and the rare-earth metal elements, magnesium fluoride, germanium oxide, and an oxide containing at least one element selected from among the group XIII elements in its composition. The Mn-activated MGF phosphor absorbs light emitted from the light source having an emission peak wavelength within the range of, for example, 400 nm or greater and 480 nm or less, and preferably emits light having an emission peak wavelength within the range of 640 nm or greater and 680 nm or less, more preferably has an emission peak wavelength within the range of 640 nm or greater and 670 nm or less, and further preferably emits light having a peak wavelength within the range of 645 nm or greater and less than 670 nm. The full width at half maximum of the Mn-activated MGF phosphor is specifically 30 nm or less, preferably 28 nm or less, more preferably 25 nm or less. The emission spectrum of the Mn-activated MGF phosphor can show a plurality of peaks within the range of 640 nm or greater and 680 nm or less. The first layer containing the Mn-activated MGF phosphor may enhance the luminous flux of the light-emitting device that emits red light.

The Mn-activated MGF phosphor preferably has the composition represented by Formula (II-I) or (II-II) below.

$$3.5\text{MgO}\cdot 0.5\text{MgF}_2\cdot \text{GeO}_2\text{:Mn} \qquad\qquad\qquad\text{(II-I)}$$

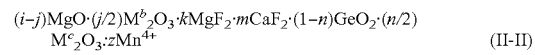

$$(i-j)\text{MgO}\cdot (j/2)M^b{}_2\text{O}_3\cdot k\text{MgF}_2\cdot m\text{CaF}_2\cdot (1-n)\text{GeO}_2\cdot (n/2)$$
$$M^c{}_2\text{O}_3\text{:}z\text{Mn}^{4+} \qquad\qquad\qquad\text{(II-II)}$$

(In Formula (II-II), $M^b$ is at least one element selected from the group consisting of Li, Na, K, Sc, Y, La, Ce, Pr, Nd, Pm, Sm, Eu, Gd, Tb, Dy, Ho, Er, Tm, Yb, and Lu, $M^c$ is at least one element selected from the group consisting of Al, Ga, and In, and i, j, k, m, n, and z are numbers respectively satisfying $2 \leq i \leq 4$, $0 \leq j < 0.5$, $0 < k < 1.5$, $0 \leq m < 1.5$, $0 < n < 0.5$, and $0 < z < 0.05$.)

Second Layer

The second layer 52 covers at least a portion of the first layer 51 and constitutes the phosphor member 50 together with the first layer 51. The second layer 52 preferably contains a resin or glass and the nitride phosphor 72 that performs wavelength conversion of light emitted from the light source 10 and/or the first layer 51. The second layer 52 can contain another phosphor that performs wavelength conversion of light emitted from the light source 10 to emit red light, in addition to the nitride phosphor 72. The nitride phosphor 72 can contain only one type of nitride phosphor or two or more types of nitride phosphors having different compositions from each other. The second layer 52 is preferably in contact with at least a portion of the first layer 51. In the case in which the second layer 52 is in contact with at least a portion of the first layer 51, light emitted from or transmitted through the first layer 51 is more likely to be absorbed, and light emitted from the light source 10 and/or the first layer 51 is more likely to be absorbed, whereby more efficient wavelength conversion can be achieved and red light with an improved luminous flux can be obtained than in the case in which the second layer 52 is apart from the first layer 51.

Nitride Phosphor

Examples of the nitride phosphor include: a europium-activated nitride phosphor containing silicon, aluminum and at least one of calcium and strontium in its composition; and a europium-activated nitride phosphor containing aluminum, at least one element selected from the group consisting of the alkaline-earth metal elements, and at least one element selected from the group consisting of the alkali-metal elements, in its composition. The nitride phosphor is preferably a europium-activated nitride phosphor that is likely to absorb light, such as light with an emission peak wavelength within the range of 400 nm or greater and 480 nm or less, emitted from the light source and contains silicon, aluminum and at least one of calcium and strontium in its composition. The nitride phosphor is likely to efficiently absorb light emitted from the light source and performs wavelength conversion of light emitted from the light source almost without allowing light in a particular wavelength range to leak from the light-emitting device, and therefore, red light with a high color purity can be obtained. The light in the particular wavelength range that substantially does not leak from the light-emitting device can be, for example, light from the light source having an emission peak wavelength in a range of 400 nm or greater and 480 nm or less. The fact that the light in the particular wavelength range substantially does not leak from the light-emitting device means that where a reference emission intensity (i.e., first reference emission intensity) is regarded as a minimum emission intensity in the emission spectrum within a range of 15 nm on both of the long wavelength side and the short wavelength side from the center that is the wavelength of a maximum emission peak (i.e., first maximum emission peak) in the emission spectrum of the light-emitting device including the first layer containing the fluoride phosphor and the second layer containing the nitride phosphor, supposing the reference emission intensity is 1, the emission intensity ratio at the wavelength of the maximum emission peak of the light source is greater than 0 and 0.1 or less.

A europium-activated nitride phosphor containing silicon, aluminum and at least one of calcium and strontium in its composition, or a europium-activated nitride phosphor containing aluminum and at least one element selected from the group consisting of the alkaline-earth metal elements in its composition absorbs light emitted from the light source having an emission peak wavelength in the range of, for example, 400 nm or greater and 480 nm or less and preferably emit light having a peak wavelength in the range of 620 nm or greater and 660 nm or less.

The nitride phosphor is preferably particles. In the case where the nitride phosphor is particles, the average particle diameter of the nitride phosphor measured by the FSSS method is preferably in a range of 5 μm or greater and 50 μm or less, more preferably in a range of 10 μm or greater and 40 μm or less, and further preferably in a range of 15 μm or greater and 35 μm or less. In the case in which the nitride phosphor is particles, and the average particle diameter measured by the FSSS method is in a range of 5 μm or greater and 50 μm or less, light emitted from the light source is likely to be absorbed efficiently, and light emitted from the light source can be subjected to wavelength conversion substantially without allowing the light in the particular wavelength range to leak from the light-emitting device, so that red light with a high color purity can be obtained. In the case in which the nitride phosphor is particles, and the average particle diameter is less than 5 μm, the efficiency of wavelength conversion of the light from the light source is lowered in some cases. In the case where the nitride phosphor is particles, and the average particle diameter exceeds 50 μm, the number of the phosphor particles relative to the mass of the phosphor contained in the second layer is decreased, and thus scattering of light in the second layer is lowered. This may, for example, make it difficult to perform the wavelength conversion substantially without allowing the light of the light source to leak in some cases.

The nitride phosphor preferably has the composition represented by Formula (III) below. In the case in which the nitride phosphor having the composition represented by Formula (III) is used, light emitted from the light source having an emission peak wavelength in the range of 400 nm or greater and 480 nm or less is likely to be absorbed, and light that is emitted from the light source can be inhibited from leaking from the light-emitting device without being subjected to wavelength conversion, so that red light with a high color purity is obtained.

$$(Ca_{1-s-t}Sr_sEu_t)_xAl_uSi_vN_w \quad (III)$$

(In Formula (III), s, t, u, v, w, and x are numbers respectively satisfying $0 \leq s < 1$, $0 < t < 1.0$, $0 < s+t < 1.0$, $0.8 \leq x \leq 1.0$, $0.8 \leq u \leq 1.2$, $0.8 \leq v \leq 1.2$, $1.9 \leq u+v \leq 2.1$, and $2.5 \leq w \leq 3.5$.)

The nitride phosphor can be a Eu-activated nitride phosphor having the composition represented by Formula (IV) below.

$$(Ca_bSr_{1-b-c-d}Ba_cEu_d)_eM^d_fAl_3N_g \quad (IV)$$

(In Formula (IV), $M^d$ is at least one alkali-metal element selected from the group consisting of Li, Na, K, Rb, and Cs, and b, c, d, e, f, and g are numbers respectively satisfying $0 \leq b \leq 1.0$, $0.001 < c \leq 0.1$, $0 \leq d \leq 0.2$, $3.0 \leq e \leq 5.0$, $0.8 \leq f \leq 1.05$, and $0.8 \leq g \leq 1.05$.)

The nitride phosphor used can be a nitride phosphor activated with Eu having a composition represented by the Formula (V) below.

$$M^e_hM^f_oEu_pAl_3N_q \quad (V)$$

(In formula, $M^e$ is at least one element selected from the group consisting of Sr, Ca, Ba, and Mg; $M^f$ is at least one element selected from the group consisting of Li, Na, and K; h, o, p, and q are numbers respectively satisfying $0.80 \leq h \leq 1.1$, $0.4 \leq o \leq 1.8$, $0.001 < p \leq 0.1$, and $1.5 \leq q \leq 5.0$.

Resin

The resin used for the first layer 51 or the second layer 52 is preferably at least one selected from the group consisting of silicone resins, modified silicone resins, epoxy resins, and modified epoxy resins. Among these resins, the resin used for the first layer 51 or the second layer 52 is more preferably a silicone resin or a modified silicone resin, which has good heat and weather resistance. Examples of silicone resins include dimethyl silicone resins, phenyl-methyl silicone resins, and diphenyl silicone resins. As the resin used for the first layer 51 or the second layer 52, one type of resin can be used singly, or two or more types may be used in combination. The resin contained in the first layer 51 can be the same as or different from the resin contained in the second layer 52. The difference in refractive index between the first layer 51 and the second layer 52 is preferably small so that wavelength conversion of light emitted from the light source or the first layer can be efficiently performed in the second layer 52. To reduce the difference in refractive index, the same type of resin is preferably used.

Glass

Examples of glass used for the first layer 51 or the second layer 52 include borosilicate glass, quartz glass, sapphire glass, calcium fluoride glass, aluminoborosilicate glass, oxynitride glass, and chalcogenide glass.

A reference emission intensity of the light-emitting device is regarded as the minimum emission intensity in an emission spectrum in the range of 15 nm or 30 nm on both of the long wavelength side and the short wavelength side from the center that is the wavelength of the maximum emission peak in the emission spectrum of the light-emitting device. Supposing a reference emission intensity is 1, an emission intensity ratio at the wavelength of the maximum emission peak of the light source is greater than 0 and 0.1 or less, and an emission intensity ratio at the wavelength of the maximum emission peak of light emitted from the light-emitting device is greater than 2.8. When the maximum emission peak wavelength in the emission spectrum of the light emitting device is less than 645 nm, the reference emission intensity is preferably a minimum emission intensity in the emission spectrum in the range of 15 nm on both of the long wavelength side and the short wavelength side from the center that is the wavelength of the maximum emission peak. When the maximum emission peak wavelength in the emission spectrum of the light emitting device is 645 nm or more, the reference emission intensity is preferably a minimum emission intensity in the emission spectrum in the range of 30 nm on both of the long wavelength side and the short wavelength side from the center that is the wavelength of the maximum emission peak.

In the emission spectrum of the light-emitting device, the wavelength of the maximum emission peak is within the red wavelength range. In the emission spectrum of the light-emitting device, the wavelength of the maximum emission peak is in the range of preferably 610 nm or greater and 670 nm or less, more preferably 620 nm or greater and 670 nm or less. In the emission spectrum of the light-emitting device, the maximum emission peak is mainly derived from red light emitted from either the Mn-activated fluoride complex phosphor or the Mn-activated MGF phosphor. In the emission spectrum of the light-emitting device, the minimum emission intensity in the emission spectrum in the range of 15 nm or 30 nm on both of the long wavelength side and the short wavelength side from the center that is the wavelength of the maximum emission peak is also in the red wavelength range and is considered to be mainly derived from red light emitted from the nitride phosphor. In the emission spectrum of the light-emitting device, it is difficult to distinguish between the spectrum derived from red light emitted from either the Mn-activated fluoride complex phosphor or the Mn-activated MGF phosphor and the spectrum derived from red light emitted from the nitride phosphor. Also in the emission spectrum in the range of 15 nm or 30 nm on both of the long wavelength side and the short wavelength side from the wavelength of the maximum emission peak, the minimum emission intensity may be constituted of the combination of the intensity derived from red light emitted from the nitride phosphor and the intensity derived from red light emitted from either the Mn-activated fluoride complex phosphor or the Mn-activated MGF phosphor.

The reference emission intensity or the light-emitting device is regarded as the minimum emission intensity in the emission spectrum in the range of 15 nm or 30 nm on both of the long wavelength side and the short wavelength side from the wavelength of the maximum emission peak in the emission spectrum of the light-emitting device. Supposing the reference emission intensity is 1, the emission intensity ratio at the wavelength of the maximum emission peak of the light source is greater than 0 and 0.1 or less. If the emission intensity ratio at the wavelength of the maximum emission peak of the light source is greater than 0 and 0.1 or less relative to the reference emission intensity in the emission spectrum of the light-emitting device, light emitted from the light-emitting device does not substantially contain light directly emitted from the light source. In the case in which the light source emits light in the blue range of 400 nm or greater and 480 nm or less, the blue light does not substantially leak from the light-emitting device, and red light with a high color purity is obtained.

Supposing the reference emission intensity is 1, the emission intensity ratio of light emitted from the light-emitting device at the wavelength of the maximum emission peak is greater than 2.8, where the reference emission intensity is regarded as the minimum emission intensity in the emission spectrum in the range of 15 nm or 30 nm on both of the long wavelength side and the short wavelength side from the wavelength of the maximum emission peak in the emission spectrum of the light-emitting device. The emission intensity ratio of light emitted from the light-emitting device at the wavelength of the maximum emission peak is preferably 3.0 or greater and 12.0 or less, more preferably 3.5 or greater and 11.0 or less in the emission spectrum of the light-emitting device supposing the reference emission intensity is 1. If the emission intensity ratio at the wavelength of the maximum emission peak is greater than 2.8 supposing the reference emission intensity is 1 in the emission spectrum, the light-emitting device emits red light with a high luminous flux. As the dominant wavelength of red light emitted from the light-emitting device shifts to the long wavelength side, the wavelength shifts away from around 555 nm, where the spectral luminous efficiency as sensed by human (this may also be referred to as "visability efficiency") is highest, and thus the spectral luminous efficiency decreases. Accordingly, the luminous flux is likely to decrease. If the emission intensity at the wavelength of the maximum emission peak is greater than 2.8 in the emission spectrum supposing the reference emission intensity is 1, a high luminous flux of red light can be maintained as light emitted from the light emitting device even in the case in which the dominant wavelength has shifted to the long wavelength side. If the emission intensity ratio at the wavelength of the maximum emission peak is 3.0 or greater and 12.0 or less supposing the reference emission intensity is 1 in the emission spectrum, red light emitted from the light-emitting device exhibits a higher luminous flux and a higher color purity. In particular, in the case in which the first layer contains the Mn-activated fluoride complex phosphor but does not contain the Mn-activated MGF phosphor, where the reference emission intensity (i.e., first reference emission intensity) is regarded as the minimum emission intensity in the emission spectrum within the range of 15 nm on both of the long wavelength side and the short wavelength side from the wavelength of the maximum emission peak, supposing the reference emission intensity is 1, the light-emitting device emits red light with an even higher luminous flux and an even higher color purity if the emission intensity ratio at the wavelength of the maximum emission peak is 3.0 or greater and 11.0 or less. The dominant wavelength is the wavelength in the CIE 1931 color space chromaticity diagram at the intersection point of the spectrum locus and the extension of a straight line connecting the chromaticity coordinates (x=0.333, y=0.333) of white light and the chromaticity coordinates (x, y) of light emitted from the light-emitting device.

The fluoride phosphor 71 contained in the first layer 51 absorbs light emitted from the light source having an emission peak wavelength in the range of, for example, 400 nm or greater and 480 nm or less and emits red light. The fluoride phosphor 71 absorbs smaller amount of light emitted from the light source having an emission peak wavelength in the range of, for example, 400 nm to 480 nm than the amount of light absorbed by the nitride phosphor 72 contained in the second layer 52, and cannot fully absorb the light emitted from the light source. This may cause leakage of the light emitted from the light source through the first layer 51. Light emitted from the light source 10 and leaking through the first layer 51 without being fully absorbed by the fluoride phosphor 71 contained in the first layer 51 is absorbed by the nitride phosphor 72 contained in the second layer 52. The nitride phosphor 2 contained in the second layer 52 absorbs light emitted from the light source 10 better than the fluoride phosphor 71. Accordingly, blue light emitted from the light source is substantially prevented from leaking from the light-emitting device 101. Light emitted from the light source 10 is subjected to wavelength conversion by the fluoride phosphor 71 and the nitride phosphor 72, and the light-emitting device emits red light with a high color purity and a high luminous flux. For example, the refractive index of the fluoride phosphor 71 contained in the first layer 51 is about 1.3 to 1.4, and the refractive index of the resin contained in the first layer 51 is about 1.4 to 1.5. The difference between these refractive indices is small. Hence, light irradiated on particles of the fluoride phosphor is likely to be transmitted through the particles of the fluoride phosphor. Even in the case in which a plurality of particles of the fluoride phosphor are irradiated with light, the proportion of light reflected by each particle of the fluoride phosphor is small, and the optical path length is short. Hence, the proportion of light reflected is smaller than the actual reflectance. On the other hand, the refractive index of the nitride phosphor 72 contained in the second layer 52 is about 2.0 to 2.3, and the refractive index of the resin contained in the second layer 52 is about 1.4 to 1.5. The difference between the refractive indices is larger than in the case of the fluoride phosphor. Hence, light irradiated to particles of the nitride phosphor is unlikely to be transmitted through the particles of the nitride phosphor than in the case of the fluoride phosphor. In the case in which a plurality of particles of the nitride phosphor are irradiated with light, the proportion of light reflected by each particle of the nitride phosphor is large, the light is scattered, and the optical path length is long. Hence, the proportion of light reflected is larger than the actual reflectance. For example, if a light source having an emission peak at about 450 nm is used, the fluoride phosphor 71 contained in the first layer 51 absorbs 50% or greater and 90% or less of light emitted from the light source, but 10% or greater of the light emitted from the light source is reflected or transmitted. On the other hand, the nitride phosphor 72 contained in the second layer 52 absorbs 90% or less of light emitted from the light source, and only 8% or less of the light emitted from the light source is reflected or transmitted. The values of reflectance spectra and the excitation spectra of the phosphors merely provide for reference purposes.

Hence, in the case in which a mixture of a resin and both of the fluoride phosphor and the nitride phosphor is used, it is difficult to obtain a light-emitting device that emits red light with a high color purity because a large proportion of light emitted from the light source is transmitted through the mixture, which leads to leakage of light emitted from the light source. On the other hand, the present embodiment can provide a light-emitting device that emits red light with a high color purity because particular phosphors are respectively mixed in the first layer and the second layer and the order of the layers is selected.

The light-emitting device is preferably a red light-emitting device including the light source, the first layer covering at least a portion of the light source and containing the Mn-activated MGF phosphor that performs wavelength conversion of light emitted from the light source, and the second layer covering at least a portion of the first layer and containing the nitride phosphor that performs wavelength conversion of light emitted from the light source and/or the first layer, where a reference emission intensity (i.e., second reference emission intensity) is regarded as the minimum emission intensity in the emission spectrum within the range of 30 nm on both of the long wavelength side and the short wavelength side from the center that is a wavelength of a maximum emission peak (i.e., second maximum emission peak) in the emission spectrum of the light-emitting device, supposing the reference emission intensity is 1, the emission intensity ratio at the wavelength of the maximum emission peak of the light source being greater than 0 and 0.1 or less, and the emission intensity ratio at the wavelength of the maximum emission peak being 2.8 or greater.

The amount of the fluoride phosphor or the nitride phosphor relative to 100 parts by mass of the resin or glass in the first layer or the second layer is in the range of preferably 20 parts by mass or greater and 200 parts by mass or less, more preferably 40 parts by mass or greater and 180 parts by mass or less, further preferably 60 parts by mass or greater and 180 parts by mass or less. If the content of the fluoride phosphor in the first layer is in the range of 20 parts by mass or greater and 200 parts by mass or less relative to 100 parts by mass of the resin or glass contained in the first layer, red light with a high luminous flux may be obtained. If the content of the nitride phosphor in the second layer is in the range of 20 parts by mass or greater and 200 parts by mass or less relative to 100 parts by mass of the resin or glass contained in the second layer, efficient absorption and wavelength conversion of light emitted from the light source and/or the first layer are performed, and red light with a high color purity may be obtained.

The mass ratio between the fluoride phosphor contained in the first layer and the nitride phosphor contained in the second layer in the case in which the amount of the nitride phosphor is 100 parts by mass is such that the amount of the fluoride phosphor is in the range of preferably 20 parts by mass or greater and 200 parts by mass or less, more preferably 40 parts by mass or greater and 180 parts by mass or less, further preferably 60 parts by mass or greater and 180 parts by mass or less. If the mass ratio between the fluoride phosphor contained in the first layer and the nitride phosphor contained in the second layer is in the range described above, red light with a high luminous flux may be obtained.

The first layer or the second layer can contain other components such as a filler, a light stabilizer, and a colorant in addition to the phosphor and the resin or glass. Examples of the filler include silica, barium titanate, titanium oxide, and aluminum oxide.

Figure 1B:
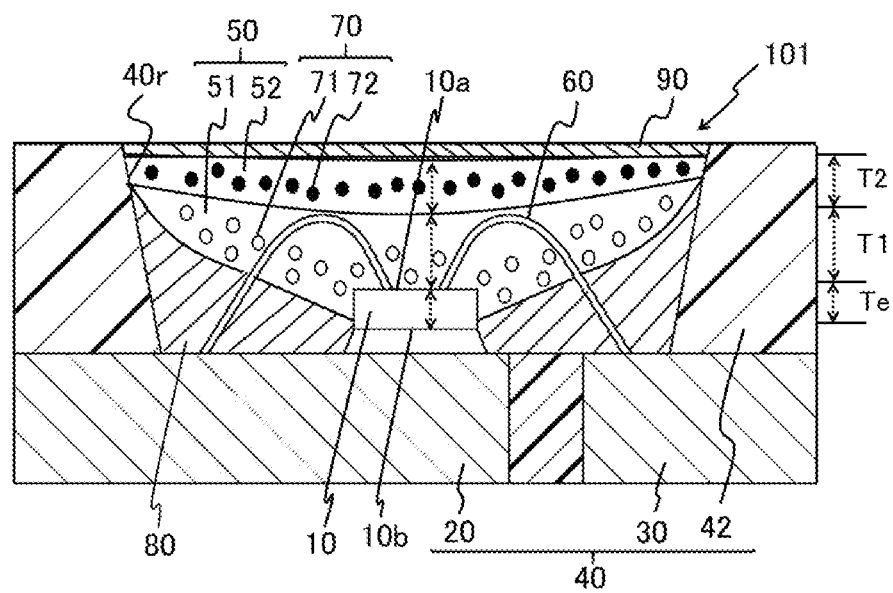
FIG. 1B is a schematic cross-sectional view illustrating the thickness of the light-emitting element, the thickness of the first layer, and the thickness of the second layer in the light-emitting device according to the first embodiment of of the present disclosure.

It is supposed that the thickness of the first layer is T1, and the thickness of the second layer is T2. In the case in which the light source is a light-emitting element, the total thickness T1+T2 of the first layer and the second layer is preferably larger than the thickness Te of the light-emitting element. The total thickness of the first layer and the second layer is, as compared to the thickness of the light-emitting element, preferably in a range of 1.1 times or greater and 3 times or less, more preferably in a range of 1.3 times or greater and 2.6 times or less, and further preferably in a range of 1.6 times or greater and 2.3 times or less. In the case in which the total thickness T1+T2 of the first layer and the second layer is in a range of 1.1 times or greater and 3 times or less as compared to the thickness Te of the light-emitting element, the light emitted from the light source is likely to be absorbed by the first layer to perform the wavelength conversion efficiently, resulting in red light emitted with an improved luminous flux. Accordingly, the light emitted from the light source is likely to be absorbed efficiently also by the second layer to perform the wavelength conversion of the light emitted from the light source substantially without allowing the light in the particular wavelength range to leak from the light-emitting device, so that red light with a high color purity is obtained. In the light-emitting device 101 of the first embodiment shown in FIG. 1A, as for the thickness of the light-emitting element 10, the thickness between the surface 10*b* of the light-emitting element 10 facing the first lead 20 and the opposite first surface 10*a* on which the pair of electrodes is formed is designated as the thickness Te of the light-emitting element 10, as shown in FIG. 1B. Also in the light-emitting device 102 of the second embodiment and the light-emitting device 103 of the third embodiment described later, the thickness of the light-emitting element 10 is the thickness between the second surface 10*b* as one surface of the light-emitting element 10 and the second surface 10*a* as the opposite other surface. In the light-emitting device 101 of the first embodiment shown in FIG. 1B, as for the total thickness T1+T2 of the first layer 51 and the second layer 52, it suffices that the total thickness T1+T2 of the first layer 51 and the second layer 52 along a line extending in the direction perpendicular to the first surface 10a of the light-emitting element 10 is in a range of 1.1 times or greater and 3 times or less the thickness Te of the light-emitting element 10 over the entire portion on the first surface 10a of the light-emitting element 10. As for the total thickness of the first layer 51 and the second layer 52, the distance from the first surface 10a opposite to the surface 10b, which is a mounting surface of the light-emitting element 10 to the first lead 20, to the surface of the second layer 52 can be generally measured as the total thickness T1+T2 of the first layer 51 and the second layer 52. For example, in the case in which the thickness of the light-emitting element is 150 µm, the total thickness of the first layer and the second layer is preferably in a range of 165 µm or greater and 450 µm or less.

The thickness T1 of the first layer 51 can be larger than the thickness T2 of the second layer 52. Supposing that the thickness T2 of the second layer 52 is 1, the thickness T1 of the first layer 51 can be in a range of 1.1 times or greater and 5 times or less, can be in a range of 1.2 times or greater and 4.5 times or less, can be in a range of 1.3 times or greater and 4 times or less, can be 3.5 times or less, can be 3 times or less, and can be 2 times or less. In the case in which the light source is the light-emitting element 10 in the light-emitting device 101 of the first embodiment shown in FIG. 1A, the ratio of the thickness T1 of the first layer 51 and the thickness T2 of the second layer 52 is the ratio of the thickness T1 of the first layer 51 and the thickness T2 of the second layer 52 along the line extending in the direction perpendicular to the first surface 10a of the light-emitting element 10 in the first surface 10a of the light-emitting element 10, as shown in FIG. 1B. Also in the light-emitting device 102 of the second embodiment and the light-emitting device 103 of the third embodiment described later, in the case in which the light source is the light-emitting element 10, the ratio of the thickness T1 of the first layer 51 and the thickness T2 of the second layer 52 is the ratio of the thickness T1 of the first layer 51 and the thickness T2 of the second layer 52 along the line extending in the direction perpendicular to the first surface 10a of the light-emitting element 10 in the first surface 10a of the light-emitting element 10 opposite to the mounting board 200. In the case in which the thickness T1 of the first layer 51 is larger than the thickness T2 of the second layer 52, the light emitted from the light source is likely to be absorbed in the first layer 51 to perform the wavelength conversion efficiently, so that red light with a high luminous flux is emitted from the light-emitting device 101, 102, or 103.

In the case in which the thickness Te of the light-emitting element is 150 µm, and the thickness T2 of the second layer is 30 µm or greater and 250 µm or less, the thickness T1 of the first layer can be in a range of 150 nm or greater and 400 nm or less, can be in a range of 200 µm or greater and 350 µm or less, and can be in a range of 200 µm or greater and 300 µm or less. In the case where the thickness of the light-emitting element is 150 µm, and the thickness T1 of the first layer is in a range of 150 µm or greater and 400 µm or less, the thickness T2 of the second layer can be in a range of 50 µm or greater and 200 µm or less, and can be in a range of 50 µm or greater and 150 µm or less. In the case in which the thickness Te of the light-emitting element is 150 µm, T1+T2 which is the total of the thickness T1 of the first layer and the thickness T2 of the second layer can be in a range of 180 µm or greater and 650 µm or less, can be in a range of 200 µm or greater and 600 µm or less, and can be in a range of 230 µm or greater and 550 µm or less.

The thickness T1 of the first layer can be equal to or smaller than the thickness T2 of the second layer. Supposing the thickness T2 of the second layer is 1, the thickness T1 of the first layer can be in a range of 0.1 time or greater and 1 time or less, can be in a range of 0.2 time or greater and 0.9 time or less, can be in a range of 0.3 time or greater and 0.8 time or less, can be 0.7 time or less, and can be 0.6 time or less. In the case in which the thickness T1 of the first layer is smaller than the thickness T2 of the second layer, the second layer can inhibit oxygen or water from entering the light-emitting device and inhibit the fluoride phosphor, which is likely to react with oxygen and water, from being deteriorated, and, for example. Accordingly, the luminous flux maintenance of the light-emitting device is less likely to be decreased in the case in which the light-emitting device is continuously lighted for a long period of time.

In the case in which the thickness Te of the light-emitting element is 150 µm, and the thickness T2 of the second layer is 50 µm or greater and 300 µm or less, the thickness T1 of the first layer can be in a range of 100 µm or greater and 300 µm or less, and can be in a range of 150 µm or greater and 300 µm or less. In the case in which the thickness of the light-emitting element is 150 µm, and the thickness T1 of the first layer is in a range of 100 µm or greater and 300 µm or less, the thickness T2 of the second layer can be in a range of 50 µm or greater and 300 µm or less, and can be in a range of 100 µm or greater and 250 µm or less. In the case in which the thickness Te of the light-emitting element is 150 µm, the total (T1+T2) of the thickness T1 of the first layer and the thickness T2 of the second layer can be in a range of 150 µm or greater and 600 µm or less, can be in a range of 200 µm or greater and 600 µm or less, and can be in a range of 230 µm or greater and 550 µm or less.

Light-Transmissive Body

In the light-emitting device 101, it is preferable that the second layer 52 be in contact with at least a portion of the first layer 51 and that a light-transmissive body 90 be included on the surface of the second layer 52 opposite to the surface in contact with the first layer 51. Allowing the second layer 52 to be in contact with at least a portion of the first layer 51 can efficiently perform wavelength conversion of light undergone wavelength conversion by the fluoride phosphor 71 contained in the first layer 51 and light emitted from the light source 10 through the first layer 51, so that the light-emitting device 101 emits red light with a high luminous flux. In the light-emitting device 101, the light-transmissive body 90 positioned on the surface of the second layer 52 opposite to the surface in contact with the first layer 51 inhibits oxygen or water existing outside the light-emitting device 101 from entering the light-emitting device 101 and protects the nitride phosphor 72 contained in the second layer 52, thereby maintaining red light emission with a high luminous flux. With the light-transmissive body 90, the strength of the light-emitting device 101 can be improved. The thickness of the light-transmissive body is not limited as long as the entry of oxygen or water into the light-emitting device is reduced, and the thickness can be in the range of, for example, 30 µm or greater and 300 µm or less, preferably 40 µm or greater and 280 µm or less, more preferably 50 µm or greater and 270 µm or less.

The light-transmissive body is preferably formed of a glass material. Examples of the glass material constituting the light-transmissive body include borosilicate glass, quartz glass, sapphire glass, calcium fluoride glass, aluminoborosilicate glass, oxynitride glass, and chalcogenide glass. Employing the light-transmissive body formed of a glass material, the entry of oxygen or water into the light-emitting device can be further reduced, and the strength of the light-emitting device can be improved without interrupting emission of red light from the second layer. In the case in which the first layer or the second layer is formed of a glass material, the light-transmissive body can be formed of the same type of glass material as the second layer or can be formed of a glass material different from the glass material for the second layer.

The light-transmissive body can be bonded to the molded body or the second layer with an adhesive. For example, an adhesive containing an epoxy resin, a silicone resin, or the like, an organic adhesive, an inorganic adhesive, or a low-melting glass, having a high refractive index can be used as the adhesive.

Reflective Member

The light-emitting device 101 can include a reflective member 80. The reflective member 80 can be in contact with a portion of the light source 10, a portion of the first layer 51, and a portion of the second layer 52. The reflective member 80 is preferably in contact with a portion of the light source 10, a portion of the first layer 51, and a portion of the second layer 52 and preferably extends from the bottom surface to the inner wall of the recess 40r of the molded body 40. The reflective member 80 can efficiently reflect light emitted from the light source 10 and light undergone wavelength conversion by the first layer 51 and the second layer 52, thereby improving the luminous flux of red light emitted from the light-emitting device 101.

The reflective member preferably contains a reflective material and a resin or glass. Examples of the reflective material include an oxide containing at least one selected from the group consisting of yttrium, zirconium, aluminum, and titanium with a reflectance of equal to or greater than a particular value at a particular wavelength. Examples of the oxide include an oxide containing at least one selected from the group consisting of yttrium, zirconium, aluminum, and titanium with a reflectance of 50% or greater of light emitted from the light source having an emission peak wavelength in the range of 400 nm or greater and 480 nm or less. The reflective member can contain a white pigment with a reflectance that is not equal to or greater than a particular value at a particular wavelength. As the white pigment, one of titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, and zirconium oxide can be used singly, or two or more of these pigments can be used in combination. There is no particular limitation on the shape of the white pigment. The shape may be irregular or crushed, but is preferably spherical in view of fluidity. The particle diameter of the white pigment is, for example, about 0.1 μm or greater and 0.5 μm or less.

A method for manufacturing the light-emitting device 101 of a first embodiment preferably includes placing the light source 10 on the first lead 20 constituting the bottom surface of the recess 40r of the molded body 40, forming the first layer 51 by covering at least a portion of the light-extracting surface of the light source 10 with a first resin composition containing a first resin and the fluoride phosphor 71 and curing the first resin composition, and forming the second layer 52 by covering at least a portion of the first layer 51 with a second resin composition containing a second resin and the nitride phosphor 72 and curing the second resin composition.

In the step of placing the light source 10 on the molded body 40, the light source 10 is die-bonded to the first lead 20, and the positive and negative electrodes on the first surface 10a (light-extracting surface) opposite to the second surface 10b (mounting surface) are respectively connected to the first lead 20 and the second lead 30 by the wires 60. The molded body 40 having the recess 40r may be formed by disposing the first lead 20 and the second lead 30 at predetermined positions in the cavity of a metal mold for resin molding, pouring a resin to be molded into the cavity, and curing the resin. Alternatively, the molded body 40 that is already made by integral molding of the first lead 20, the second lead 30, and the resin can be purchased. The reflective member 80 can be formed by pouring a resin composition for the reflective member into the recess 40r of the molded body 40 before the first layer 51 and the second layer 52 are formed, or the molded body 40 provided with the reflective member 80 can be purchased.

In the step of forming the first layer 51, the first layer 51 containing the fluoride phosphor 71 can be formed by dropping the first resin composition with a dispenser or the like such that the first resin composition is in contact with at least a portion of the light-extracting surface of the light source 10 placed in the recess 40r of the molded body 40 and hardening the first resin composition.

In the step of forming the second layer 52, the second layer 52 containing the nitride phosphor 72 can be formed in contact with at least a portion of the first layer 51 by dropping the second resin composition on the first layer 51 from above the first layer with a dispenser or the like such that the second resin composition is in contact with at least a portion of the first layer 51, and curing the second resin composition. After the second layer 52 is formed, the light-transmissive body 90 can be formed on the surface of the second layer 52 opposite to the surface in contact with the first layer 51. In the case in which a collective molded body having a plurality of recesses 40r and including a plurality of molded bodies integral with one another is used, a singulating step can be included in which the collective molded body is cut and singulated into individual molded bodies. The collective molded body can be singulated by, for example, cutting with a lead-cutting mold or a dicing saw or cutting with laser light.

Figure 2:
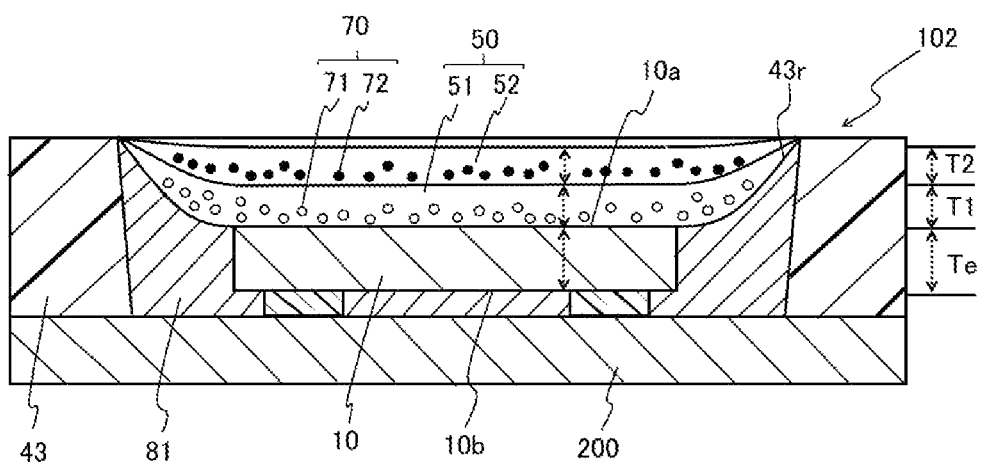
FIG. 2 is a schematic cross-sectional view illustrating a light-emitting device according to a second embodiment of the present disclosure.

FIG. 2 is a schematic cross-sectional view illustrating a second embodiment of the light-emitting device. A light-emitting device 102 embodying the second embodiment differs from the light-emitting device 101 embodying the first embodiment in that the light source 10, which is the light-emitting element described above, is flip-chip mounted on a mounting board 200 with the electrode-formed surface serving as the mounting surface, and in that a resin molded portion 43 that is integral with the mounting board 200 and constitutes the lateral wall of the recess is included instead of the molded body 40 made by integral molding with the first lead and the second lead. The other features are common to both light-emitting devices.

Mounting Board

At least one light source 10 is placed on the mounting board 200, and the mounting board 200 electrically connects the light-emitting device 102 to an external device. The mounting board 200 includes a flat plate-shaped supporting member and an electrical conductor wiring disposed on the surface of and/or inside the supporting member. The supporting member of the mounting board 200 is formed into a flat plate shape and may be provided with a heat dissipating member or a heat dissipating terminal. The supporting member is preferably made of an insulating material, and examples of the insulating material constituting the supporting member include ceramics such as alumina, aluminum nitride, and mullite, and resins such as phenolic resins, epoxy resins, polyimide resins, bismaleimide-triazine resins, and polyphthalamide (PPA). The mounting board 200 can be formed by dropping a resin or pouring the resin into a cavity and curing the resin. The electrical conductor wiring and the heat dissipating terminal can be formed of, for example, a metal such as Cu, Ag, Au, Al, Pt, T1, W, Pd, Fe, and Ni or an alloy of these metals. The electrical conductor wiring can be formed by a method such as electroplating, electroless plating, vapor deposition, and sputtering.

A method for manufacturing the light-emitting device 102 of the second embodiment includes, for example, flip-chip mounting the light source 10 on the mounting board 200 inside the recess of the resin molded portion 43, disposing a reflective member 81 around the light source 10, disposing the first layer 51 in contact with the reflective member 81, and disposing the second layer 52 on the first layer 51. Similarly to the reflective member 80, the reflective member 81 preferably contains a reflective material and a resin or glass. The reflective material can be the same material as for the reflective member 80. The reflective member 81 can be formed by dropping a composition for the reflective member containing the reflective material and a resin or glass around the light source 10 in the recess of the resin molded portion 43 and hardening the composition.

In the case in which the light source 10 is a light-emitting element, for example, the second surface 10b provided with the pair of positive and negative electrodes can be flip-chip mounted (i.e., face-down mounted) on the conductor wiring of the mounting board 200 with bonding members such as bumps disposed therebetween. In the case in which the light-emitting element used as the light source 10 is flip-chip mounted (i.e. face-down mounted) on the mounting board 200, the first surface 10a of the light source 10 opposite to the second surface 10b provided with the pair of electrodes serves as the main light-extracting surface.

In the light-emitting device 102, the reflective member 81 preferably covers at least a portion of the light source 10, at least a portion of the first layer 51, and the upper surface of the mounting board 200 except the portion on which the light source 10 is flip-chip mounted. The reflective member 81 can be formed by supplying a third resin composition constituting the reflective member 81 to a recess 43r of the resin molded portion 43 and hardening the third resin composition. The reflective member 81 can be formed of the same raw materials as the raw materials constituting the reflective member used for the light-emitting device 101 of the first embodiment. The reflective member 81 can contain a reflective material or a white pigment and preferably a resin. In the case in which the light source 10 flip-chip mounted is a light-emitting element, the reflective member 81 can cover the entire lateral surfaces or a portion of the lateral surfaces of the light-emitting element. In the case in which the reflective member 81 covers a portion of the lateral surfaces or the entire lateral surfaces of the light-emitting element serving as flip-chip mounted light source 10, and the inner surface of the recess of the resin molded portion 43 extends from the upper surface of the mounting board 200 to the height of the upper surface of the resin molded portion 43 constituting the lateral wall of the recess, light is not extracted from the lateral surface of the second layer 52 that could be a light emission surface, whereby red light can be emitted from the upper surface of the second layer 52 with less variation in the light emission direction.

The first layer 51 containing the fluoride phosphor 71 can be formed by using the first resin composition containing the fluoride phosphor 71 and the resin and curing the first resin composition. The first resin composition is preferably dropped in the recess 43r of the resin molded portion 43 such that the dropped first resin composition is in contact with the reflective member 81, and hardened. The second resin composition containing the nitride phosphor 72 and the resin is dropped on the first layer 51, and the second resin composition is hardened, so that the second layer 52 can be formed in contact with the first layer 51. Instead of dropping the second resin composition on the first layer 51, the second layer 52 may be formed separately from the first layer 51 by curing the second resin composition, bringing into contact with the first layer 51, and bonding to the first layer 51 with an adhesive. The first layer 51 can be formed by subjecting the fluoride phosphor 71 to, for example, centrifugal sedimentation before the resin or glass is hardened so that the fluoride phosphor 71 will be disposed predominantly close to the light source 10 and then hardening the first resin composition. The second layer 52 may also be formed by subjecting the nitride phosphor 72 to natural sedimentation or centrifugal sedimentation before the resin or glass is hardened so that the nitride phosphor 72 will be disposed predominantly close to the first layer 51 and then hardening the second resin composition. In the case in which the fluoride phosphor 71 or the nitride phosphor 72 is localized positioned, a clear layer substantially not containing the fluoride phosphor 71 or the nitride phosphor 72 can be respectively formed in the first layer 51 and the second layer 52, and the clear layer not containing the nitride phosphor 72 can be formed on the surface of the second layer 52 opposite to the surface in contact with the first layer 51. In the case in which the clear layer not containing the nitride phosphor 72 is formed on the surface of the second layer 52 opposite to the surface in contact with the first layer 51, the clear layer can reduce the entry of oxygen or water into the light-emitting device 102.

In the case of a collective body having a plurality of recesses 43r and including a plurality of resin molded portions 43 integral with one another, a singulating step of cutting and singulating the collective body into individual light-emitting devices 102 each in which includes at least one light source 10 may be included. The collective body can be singulated by the same method as for singulating the collective molded body described above.

In the light-emitting device 102 of the second embodiment, the total thickness T1+T2 of the first layer and the second layer along the line extending in the direction perpendicular to the first surface 10a of the light-emitting element 10 in the first surface 10a of the light-emitting element 10 is preferably larger than the thickness Te of the light-emitting element. In the light-emitting device 102 of the second embodiment, the total thickness T1+T2 of the first layer and the second layer along the line extending in the direction perpendicular to the first surface 10a of the light-emitting element 10 in the first surface 10a of the light-emitting element 10 is, compared to the thickness Te of the light-emitting element, preferably a thickness in a range of 1.1 times or greater and 3 times or less, more preferably a thickness in a range of 1.3 times or greater and 2.6 times or less, and further preferably a thickness in a range of 1.6 times or greater and 2.3 times or less. In the light-emitting device 102 of the second embodiment, the thickness T1 of the first layer 51 along the line extending in the direction perpendicular to the first surface 10a of the light-emitting element 10 in the first surface 10a of the light-emitting element 10 can be larger than the thickness T2 of the second layer 52. Supposing that the thickness T2 of the second layer 52 is 1, the thickness T1 of the first layer 51 can be in a range of 1.1 times or greater and 5 times or less, can be in a range of 1.2 times or greater and 4.5 times or less, can be in a range of 1.3 times or greater and 4 times or less, can be 3.5 times or less, can be 3 times or less, and can be 2 times or less. In the light-emitting device 102 of the second embodiment, the thickness T1 of the first layer 51 along the line extending in the direction perpendicular to the first surface 10a of the light-emitting element 10 in the first surface 10a of the light-emitting element 10 can be equal to or smaller than the thickness T2 of the second layer 52. Supposing that the thickness T2 of the second layer 52 is 1, the thickness T1 of the first layer 51 can be in a range of 0.1 time or greater and 1 time or less, can be in a range of 0.2 time or greater and 0.9 time or less, can be in a range of 0.3 time or greater and 0.8 time or less, can be 0.7 time or less, and can be 0.6 time or less.

Figure 3:
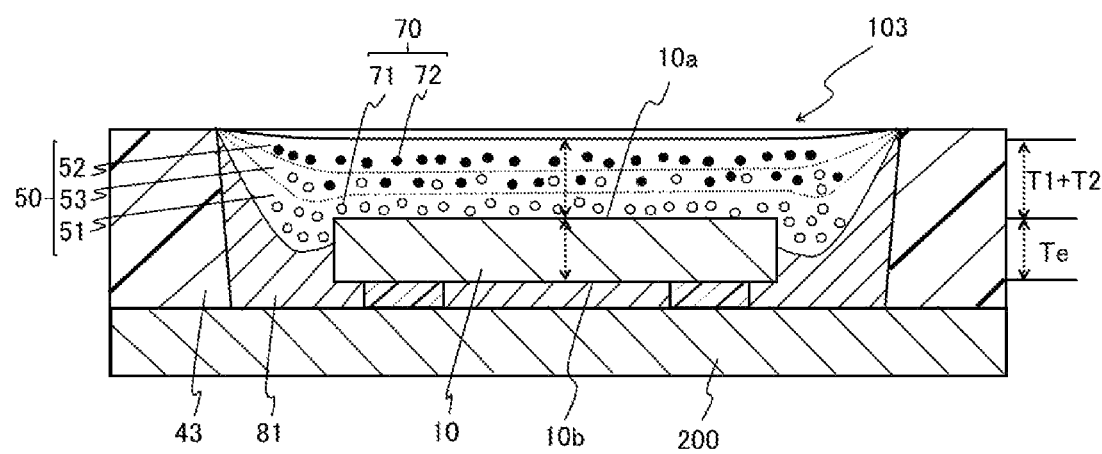
FIG. 3 is a schematic cross-sectional view of a light-emitting device according to a third embodiment of the present disclosure.

FIG. 3 is a schematic cross-sectional view illustrating a third embodiment of the light-emitting device. A light-emitting device 103 embodying the third embodiment differs from the light-emitting device 102 embodying the second embodiment in that an intermediate region 53 exists instead of the interface between the first layer 51 and the second layer 52 and in that the reflective member 81 covers a portion of the lateral surfaces of the light source 10. The other features are common to both light-emitting devices.

Intermediate Region

The light-emitting device 103 includes the first layer 51 and the second layer 52 continuous with each other and the intermediate region 53 between the first layer 51 and the second layer 52. The intermediate region 53 contains the fluoride phosphor 71, the nitride phosphor 72, and a resin or glass. The first layer 51 contains the fluoride phosphor 71 and the resin or glass. The intermediate region 53 contains the fluoride phosphor 71, the nitride phosphor 72, and the resin or glass. The second layer 52 contains the nitride phosphor 72 and the resin or glass. The first resin composition contains the fluoride phosphor 71 and the resin or glass, and constitutes the first layer 51. The second resin composition contains the nitride phosphor 72 and the resin or glass, and constitutes the second layer 52. The first layer, the intermediate region, and second layer are continuously manufactured without interfaces between the layers or region by disposing the first resin composition around the light source 10, disposing the second resin composition before the first resin composition is hardened such that at least a portion of the second resin composition is continuous with the first resin composition, and then hardening the first resin composition and the second resin composition. Heat generated from the light source is more easily dissipated into the outside, and the heat dissipation performance is improved in the case in which the first layer 51, the intermediate region 53, and the second layer 52 are continuously disposed without interfaces than in the case in which the interface between the first layer 51 and the second layer 52 exists.

In a method for manufacturing the light-emitting device 103, the first resin composition containing the fluoride phosphor 71 and the resin is formed on the light source 10 by potting, and the second resin composition containing the nitride phosphor 72 is formed by potting before the first resin composition is hardened. Before the second resin composition is formed by potting, the fluoride phosphor 71 in the first resin composition formed on the light source 10 by potting can be subjected to natural sedimentation or centrifugal sedimentation so that the fluoride phosphor 71 is disposed predominantly close to the light source. After the second resin composition is formed on the first resin composition by potting, natural sedimentation or centrifugal sedimentation can be performed so that the nitride phosphor 72 is disposed predominantly close to the first resin composition. The interface between the first resin composition and the second resin composition is not formed before the first resin composition is hardened, and the intermediate region 53 containing both the fluoride phosphor 71 and the nitride phosphor 72 is formed. At this time, as for the particle diameters of the phosphors in the first layer 51 and the second layer 52, the average particle diameter of the fluoride phosphor 71 contained in the first layer 51 is preferably larger than the average particle diameter of the nitride phosphor 72 contained in the second layer 52. According to the structure, at the time when the phosphors are disposed in the first layer 51 and the second layer 52, the fluoride phosphor 71 contained in the first layer 51 is less likely to be mixed in the second layer 52 except for the intermediate region 53, and the nitride phosphor 72 contained in the second layer 52 is less likely to be mixed in the first layer 51 except for the intermediate region 53, through natural sedimentation or centrifugal sedimentation. Accordingly, the luminous flux is inhibited to be decreased with good heat dissipation. The fluoride phosphor 71 and the nitride phosphor 72 are more thermally conductive than resins or glass. Thus, in the case in which the intermediate region 53 is formed without the interface between the first layer 51 and the second layer 52, the path of heat through the resin or glass in the heat dissipation path is shorter than in the case in which the clear layer not substantially containing the fluoride phosphor 71 or the nitride phosphor 72 is formed between the first layer 51 and the second layer 52. The dissipation performance of heat generated from the light source 10 is therefore improved. The second layer 52 can include the clear layer that does not substantially contain the nitride phosphor 72 on the surface opposite to the light source 10. Forming the clear layer on the surface of the second layer 52 opposite to the light source 10 can reduce the entry of oxygen or water into the light-emitting device 103.

In the light-emitting device 103 of the third embodiment, it is difficult to individually measure the thickness of the intermediate region 53 alone, and it is also difficult to measure while separating between the thickness T1 of the first layer 51 and the thickness of the intermediate region 53, and between the thickness T2 of the second layer 52 and the thickness of the intermediate region 53. In the case in which the first layer 51, the second layer 52, and the intermediate region 53 are formed in the light-emitting device 103, the total thickness of the first layer 51, the second layer 52, and the intermediate region 53 can be measured as the total thickness T1+T2 of the thickness T1 of the first layer 51 and the thickness T2 of the second layer 52. In the light-emitting device 103 of the third embodiment, the total thickness T1+T2 of the first layer 51, the intermediate region 53, and the second layer 52 along the line extending in the direction perpendicular to the first surface 10a of the light-emitting element 10 in the first surface 10a of the light-emitting element 10 is preferably larger than the thickness Te of the light-emitting element 10. In the light-emitting device 103 of the third embodiment, the total thickness T1+T2 of the first layer 51, the intermediate region 53, and the second layer 52 along the line extending in the direction perpendicular to the first surface 10a of the light-emitting element 10 in the first surface 10a of the light-emitting element 10 is preferably a thickness, as compared to the thickness Te of the light-emitting element 10, in a range of 1.1 times or greater and 3 times or less, more preferably a thickness in a range of 1.3 times or greater and 2.6 times or less, and further preferably a thickness in a range of 1.6 times or greater and 2.3 times or less. In the light-emitting device 103 of the third embodiment, the thickness Te of the light-emitting element 10 and the total thickness T1+T2 of the first layer 51, the intermediate region 53, and the second layer 52 are preferably the thickness Te of the light-emitting element 10 and the total thickness T1+T2 of the first layer 51, the intermediate region 53, and the second layer 52, along a line extending in the direction perpendicular to the first surface 10a of the light-emitting element 10.

EXAMPLES

Specific description will be given as below referring to examples, however, the present invention is not limited to these examples.

Fluoride Complex Phosphor 71-1

As a Mn-activated fluoride complex phosphor 71-1, a fluoride phosphor having the composition represented as $K_2[SiMn^{4+}F_6]$ was provided. The emission spectrum and the reflectance spectrum of the fluoride complex phosphor 71-1 were measured by a method described later. The fluoride complex phosphor 71-1 having the composition represented as $K_2[SiMn^{4+}F_6]$ had an emission peak wavelength of 631 nm, and the full width at half maximum of the maximum emission peak was 2.6 nm. In the case in which the emission peak wavelength of the excitation light was 450 nm, the reflectance of the fluoride complex phosphor 71-1 was 22.0%. The reflectance measured using the reflectance spectrum of each phosphor is a value for reference purposes. The refractive indices of fluoride complex phosphors 71-1 and 71-2 were 1.36. The refractive indices of fluoride complex phosphors, an MGF phosphor, nitride phosphors, and a silicone resin are calculated values. The average particle diameter of the fluoride complex phosphors 71-1 measured by the FSSS method described below is 29.0 μm.

Fluoride Complex Phosphor 71-2

As the Mn-activated fluoride complex phosphor 71-2, a fluoride phosphor having the composition represented as $K_2[SiMn^{4+}F_6]$ was provided. The emission spectrum and the reflectance spectrum of the fluoride complex phosphor 71-2 were measured by a method described later. The fluoride complex phosphor 71-2 having the composition represented as $K_2[SiMn^{4+}F_6]$ had an emission peak wavelength of 631 nm, and the half-width of the maximum emission peak was 2.6 nm. In the case in which the emission peak wavelength of the excitation light was 450 nm, the reflectance of the fluoride complex phosphor 71-2 was 12.2%. The average particle diameter of the fluoride complex phosphors 71-2 measured by the FSSS method described below is 70.5 μm.

MGF Phosphor 71-3

As a Mn-activated MGF phosphor 71-3, an MGF phosphor 71-3 having the composition represented as

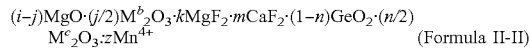

(Formula II-II)

above) was provided. The emission spectrum and the reflectance spectrum of the MGF phosphor 71-3 were measured by a method described later. The MGF phosphor 71-3 having the composition represented by Formula (II-II) had an emission peak wavelength of 670 nm, and the full width at half maximum of the maximum emission peak was 25 nm. In the case in which the emission peak wavelength of the excitation light was 450 nm, the reflectance of the MGF phosphor 71-3 was about 40%, and its refractive index was 1.70 to 1.81. The average particle diameter of the Mn-activated MGF phosphor 71-3 measured by the FSSS method was 20.5 μm.

Nitride Phosphor 72-1

As a nitride phosphor 72-1, a nitride phosphor having the composition represented as $(Ca,Sr,Eu)AlSiN_3$ was provided. The emission spectrum and the reflectance spectrum of the nitride phosphor were measured by a method described later. The nitride phosphor having the composition represented as $(Ca,Sr,Eu)AlSiN_3$ had an emission peak wavelength of 635 nm, and the full width at half maximum of the maximum emission peak was 78.9 nm. The refractive indices of nitride phosphors 72-1, 72-2, 72-3 and 72-4 were 2.15 to 2.25. The average particle diameter of the nitride phosphor 72-1 measured by the FSSS method was 14.1 μm.

Nitride Phosphor 72-2

As the nitride phosphor 72-2, a nitride phosphor having the composition represented as $(Ca,Sr,Eu)AlSiN_3$ was provided. The emission spectrum and the reflectance spectrum of the nitride phosphor were measured by a method described later. The nitride phosphor 72-2 having the composition represented as $(Ca,Sr,Eu)AlSiN_3$ had an emission peak wavelength of 648 nm, and the full width at half maximum of the maximum emission peak was 86.8 nm. In the case in which the emission peak wavelength of the excitation light was 450 nm, the reflectance of the nitride phosphor 72-2 was 7.0%. The average particle diameter of the nitride phosphor 72-2 measured by the FSSS method was 10.4 μm.

Nitride Phosphor 72-3

As a nitride phosphor 72-3, a nitride phosphor having the composition represented as $(Ca,Eu)AlSiN_3$ was provided. The emission spectrum and the reflectance spectrum of the nitride phosphor were measured by a method described later. The nitride phosphor 72-3 having the composition represented as $(Ca,Eu)AlSiN_3$ had an emission peak wavelength of 665 nm, and the full width at half maximum of the maximum emission peak was 90.7 nm. In the case in which the emission peak wavelength of the excitation light was 450 nm, the reflectance of the nitride phosphor 72-3 was 6.6%. The average particle diameter of the nitride phosphor 72-3 measured by the FSSS method was 10.2 μm.

Nitride Phosphor 72-4

As a nitride phosphor 72-4, a nitride phosphor having the composition represented as $(Ca,Sr,Eu)AlSiN_3$ was provided. The emission spectrum and the reflectance spectrum of the nitride phosphor were measured by a method described later. The nitride phosphor having the composition represented as $(Ca,Sr,Eu)AlSiN_3$ had an emission peak wavelength of 633 nm, and the full width at half maximum of the maximum emission peak was 76 nm. In the case in which the emission peak wavelength of the excitation light was 450 nm, the reflectance of the nitride phosphor 72-4 was 5.0%. The average particle diameter of the nitride phosphor 72-4 measured by the FSSS method was 12.0 μm.

Evaluation of Each Phosphor

Emission Spectrum

Figure 4:
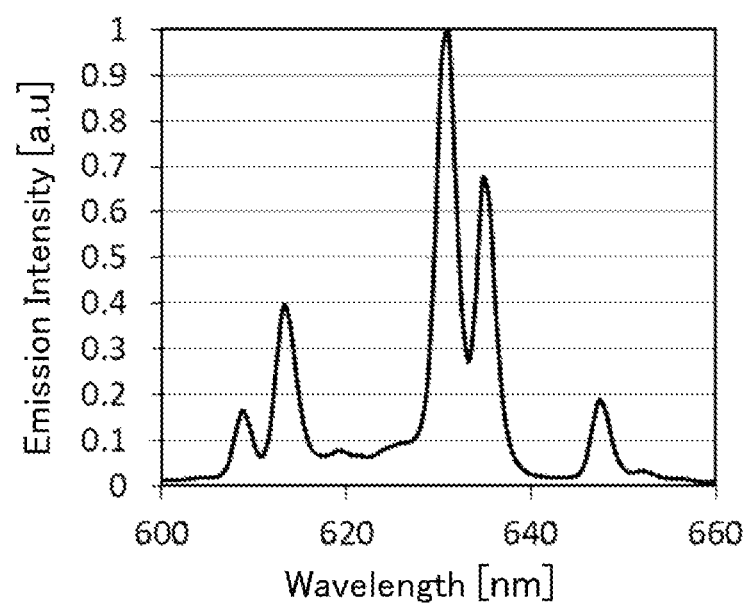
FIG. 4 shows an emission spectrum of a fluoride complex phosphor.
Figure 5:
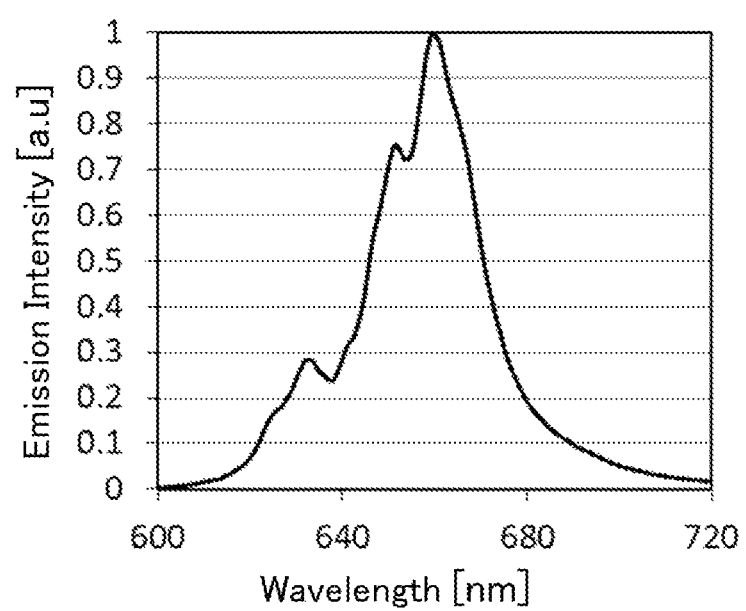
FIG. 5 shows an emission spectrum of a fluorogermanate phosphor.
Figure 6:
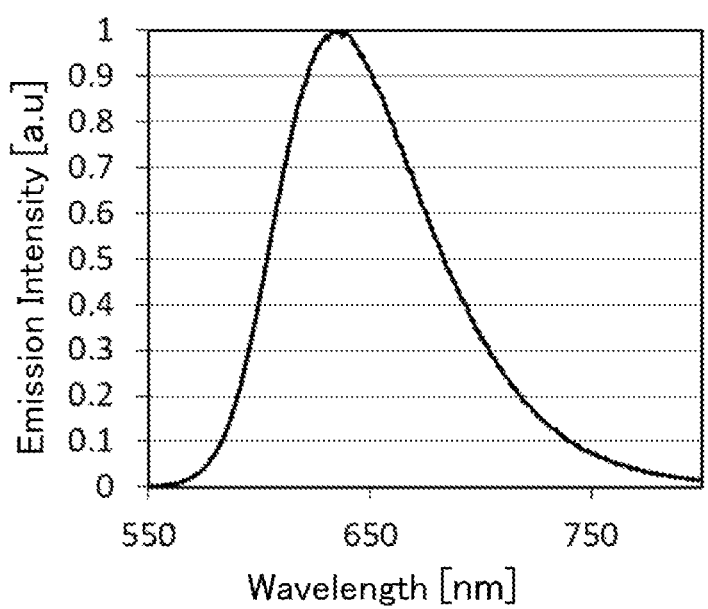
FIG. 6 shows an emission spectrum of a nitride phosphor 72-1 ($(Ca,Sr,Eu)AlSiN_3$).
Figure 7:
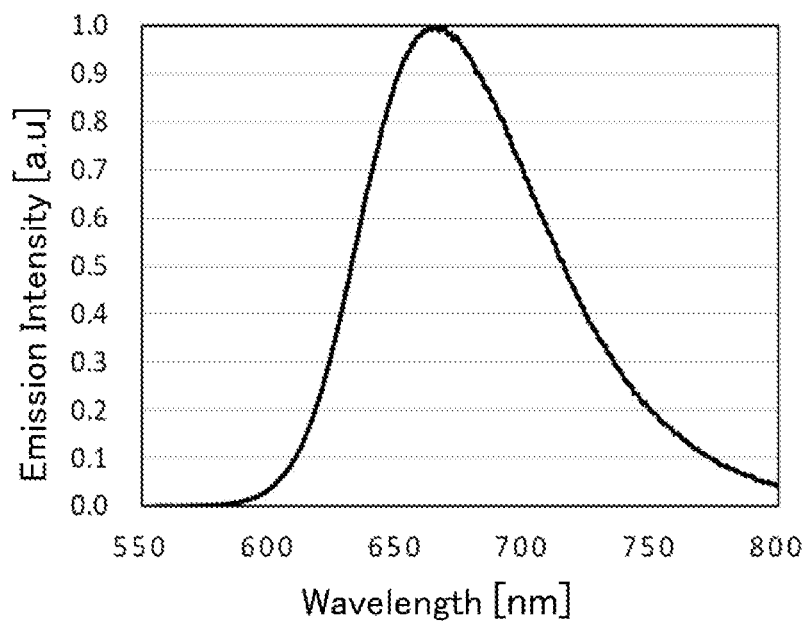
FIG. 7 shows an emission spectrum of a nitride phosphor 72-3 ($(Ca,Eu)AlSiN_3$).

The emission spectra of the fluoride complex phosphors, the MGF phosphor, and the nitride phosphors at room temperature (25° C.±5° C.) were measured by irradiating the fluoride or nitride phosphor with light with an excitation wavelength of 450 nm using a quantum efficiency measurement apparatus (manufactured by Otsuka Electronics Co., Ltd., product name: QE-2000). FIG. 4 shows the emission spectrum of the fluoride complex phosphor 71-1 having the composition represented as $K_2[SiMn^{4+}F_6]$. FIG. 5 shows the emission spectrum of the MGF phosphor 71-3 having the composition represented by Formula (II-II). FIG. 6 shows the emission spectrum of the nitride phosphor 72-1 having the composition represented as $(Ca,Sr,Eu)AlSiN_3$. FIG. 7 shows the emission spectrum of the nitride phosphor 72-3 having the composition represented as $(Ca,Eu)AlSiN_3$.

Reflectance Spectrum

The reflectance spectra of the fluoride complex phosphors, the MGF phosphor, and the nitride phosphors in the wavelength range of 380 nm or greater and 730 nm or less were measured by irradiating the fluoride or nitride phosphor, which was a sample, with light emitted from a halogen lamp serving as an excitation light source at room temperature (25° C.±5° C.) using a spectrofluorometer (manufactured by Hitachi High-Technologies Corporation, product name: F-4500), and performing excitation and emission scans of the spectrofluorometer synchronously over the wavelengths. Calcium hydrogenphosphate ($CaHPO_4$) was used as the reference sample. The reflectance of each of the fluoride complex phosphors, the MGF phosphor, and the nitride phosphors was determined as a relative reflectance relative to the reflectance of calcium hydrogenphosphate of excitation light with an emission peak wavelength of 450 nm.

Average Particle Diameter

The average particle diameters of the phosphors were measured by the FSSS method using Fisher Sub-sieve Sizer Model 95 (manufactured by Fisher Scientific International, Inc.).

Example 1

A light-emitting device 102 of the embodiment shown in FIG. 2 was manufactured. A light-emitting element including a GaN semiconductor with an emission peak wavelength of 450 nm was used as the light source 10. In the light-emitting device 102, the light-emitting element serving as the light source 10 was flip-chip mounted on the mounting board 200. A first resin composition containing a silicone resin and a fluoride phosphor 71 that contained the fluoride complex phosphor 71-1 and did not contain the MGF phosphor, at a compounding ratio (parts by mass) shown in Table 1 was dropped such that the first resin composition was brought into contact with at least a portion of the light source 10. Then the first resin composition was cured to form the first layer 51 containing the fluoride phosphor 71. Subsequently, a second resin composition containing a silicone resin and the nitride phosphor 72-1 at a compounding ratio (parts by mass) shown in Table 1 was dropped on the first layer 51 such that the second resin composition was brought into contact with at least a portion of the first layer 51. Then the second resin composition was cured to form the second layer 52 containing the nitride phosphor 72. The refractive indices of the silicone resins were 1.4 to 1.5.

Comparative Example 1

Figure 14:
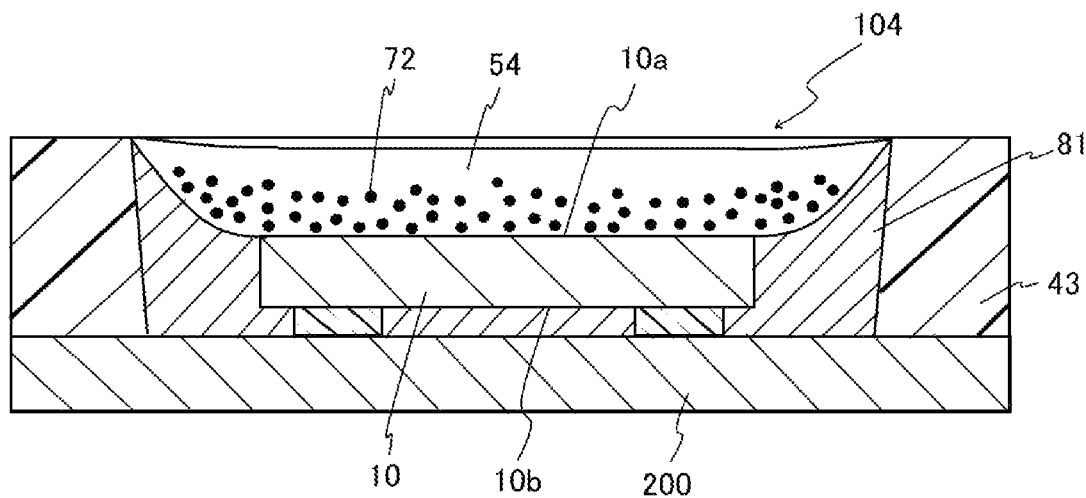
FIG. 14 is a schematic cross-sectional view illustrating a light-emitting device according to Comparative Example 1.

A light-emitting device 104 of an embodiment shown in FIG. 14 was manufactured. The light-emitting device 104 differs from the light-emitting device 102 of the embodiment shown in FIG. 2 in that a single phosphor layer 54 containing the nitride phosphor 72-1 is included. A resin composition for the phosphor layer containing a silicone resin and the nitride phosphor 72-1 at a compounding ratio (parts by mass) shown in Table 1 was dropped such that the resin composition for the phosphor layer was brought into contact with at least a portion of the light source 10. Then the resin composition was cured to form the phosphor layer 54.

Comparative Example 2

Figure 15:
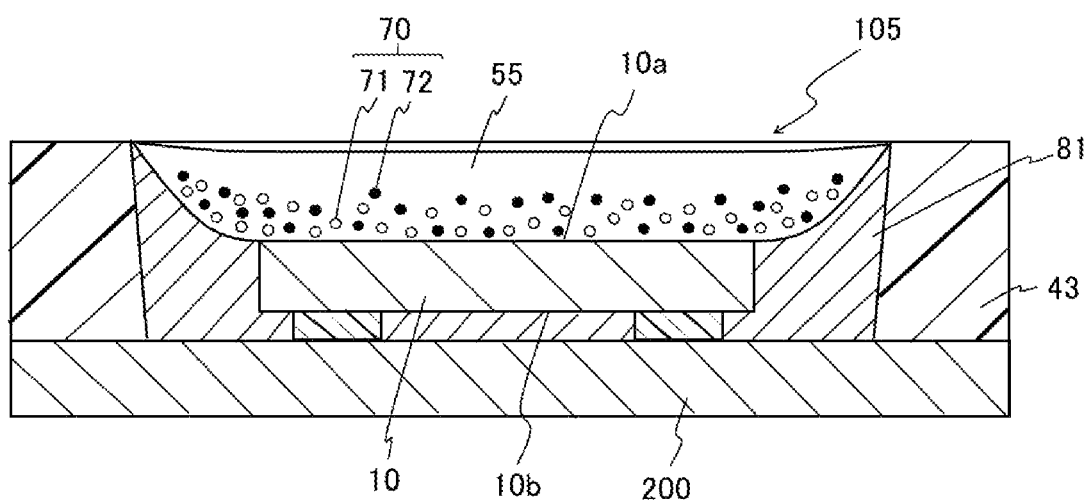
FIG. 15 is a schematic cross-sectional view illustrating a light-emitting device according to Comparative Example 2.

A light-emitting device 105 of a embodiment shown in FIG. 15 was manufactured. The light-emitting device 105 differs from the light-emitting device 102 of the embodiment shown in FIG. 2 in that a single phosphor layer 55 containing the fluoride complex phosphor 71-1 and the nitride phosphor 72-1 is included. A resin composition for the phosphor layer containing a silicone resin, the fluoride complex phosphor 71-1, and the nitride phosphor 72-1 at a compounding ratio (parts by mass) shown in Table 1 was dropped such that the resin composition for the phosphor layer was brought into contact with at least a portion of the light source 10. Then the resin composition was cured to form the single phosphor layer 55 containing the fluoride complex phosphor 71-1 and the nitride phosphor 72-1.

Comparative Example 3

Figure 16:
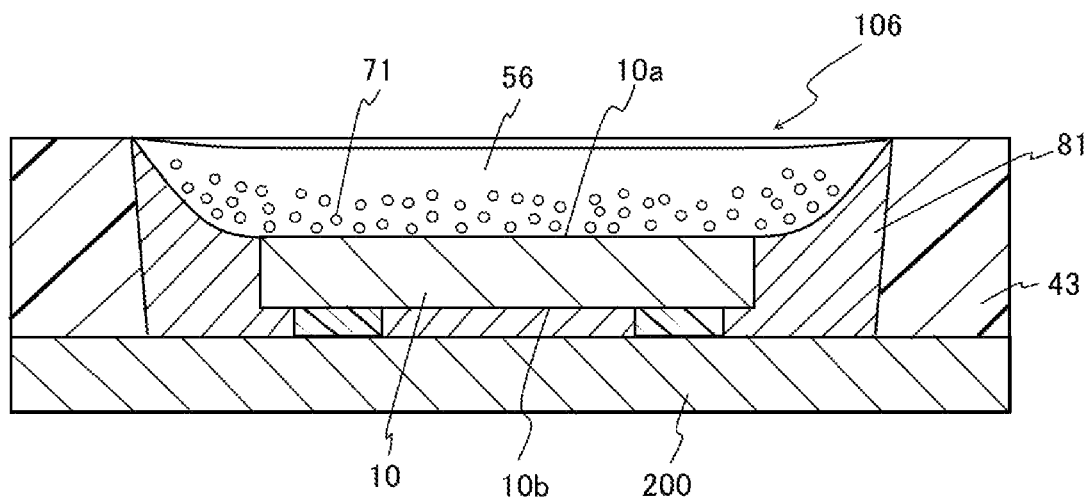
FIG. 16 is a schematic cross-sectional view illustrating a light-emitting device according to Comparative Example 3.

A light-emitting device 106 of an embodiment shown in FIG. 16 was manufactured. The light-emitting device 106 differs from the light-emitting device 102 of the embodiment shown in FIG. 2 in that a single phosphor layer 56 containing the fluoride complex phosphor 71-1 is included. A resin composition for the phosphor layer containing a silicone resin and the fluoride complex phosphor 71-1 at a compounding ratio (parts by mass) shown in Table 1 was dropped such that the resin composition for the phosphor layer was brought into contact with at least a portion of the light source 10. Then the resin composition was cured to form the single phosphor layer 56 containing the fluoride complex phosphor 71-1.

Evaluation of Light-Emitting Device

Emission Spectrum

The emission spectrum showing the emission intensity of each of the light-emitting devices in the example and the comparative examples depending on the wavelength was measured with a total luminous flux measurement apparatus that was substantially the same as in a measurement of the relative luminous flux. In the emission spectrum of each light-emitting device, the wavelength of the maximum emission peak, the minimum emission intensity, and the wavelength of the minimum emission intensity were determined. The minimum emission intensity and the wavelength of the minimum emission intensity in the emission spectrum herein is a minimum emission intensity and its wavelength in the range of 15 nm or 30 nm on both of the long wavelength side and the short wavelength side from the center that was the wavelength of the maximum emission peak. A reference emission intensity was regarded as the minimum emission intensity in the emission spectrum within the range of 15 nm or 30 nm on both of the long wavelength side and the short wavelength side from the center that was the wavelength of the maximum emission peak. In the emission spectrum of the light-emitting device, the wavelength of the maximum emission peak, the emission intensity ratio at the wavelength of the maximum emission peak supposing a reference emission intensity was 1. On this basis, the emission intensity ratio at the emission peak wavelength of the light source were determined. The dominant wavelengths of light-emitting devices of Examples 1 and 2 and Comparative Examples 1 to 5 were determined. The dominant wavelength was regarded as the wavelength in the CIE 1931 color space chromaticity diagram at the intersection point of the spectrum locus and the extension of a straight line connecting the chromaticity coordinates (x=0.333, y=0.333) of white light and the chromaticity coordinates (x, y) of light emitted from the light-emitting device.

Chromaticity (x, y)

The chromaticity coordinates x and y according to the CIE 1931 chromaticity diagram of the light-emitting devices in the examples and the comparative examples were measured with an optical measurement system that was a combination of a multichannel spectroscope and an integrating sphere.

Color Purity (%)

The color purities of the light-emitting devices in the examples and the comparative examples were measured with an optical measurement system that was a combination of a multichannel spectroscope and an integrating sphere. A color purity (%) represents the depth of the color of light emitted from a light-emitting device.

Luminous Flux (lm)

The luminous fluxes of the light-emitting devices in the examples and the comparative examples were measured with a total luminous flux measurement apparatus employing an integrating sphere.

Table 1 shows the results of evaluations of the light-emitting devices according to Example 1 and Comparative Examples 1 and 2.

TABLE 1

| | Compounding ratio (part by mass) | | | | Wavelength of maximum emission peak (nm) | Wavelength of reference emission intensity (nm) | Emission intensity ratio at wavelength of maximum emission peak | Light source Emission peak wavelength (nm) | Light source Emission intensity ratio at emission peak wavelength | Chromaticity x | Chromaticity y | Dominant wavelength (nm) | Color purity (%) | Luminous flux (lm) |
|---|---|---|---|---|---|---|---|---|---|---|---|---|---|---|
| | First layer | | Second layer | | | | | | | | | | | |
| | Fluoride complex phosphor 71-1 | Resin | Nitride phosphor 72-1 | Resin | | | | | | | | | | |
| Example 1 | 150 | 100 | 100 | 100 | 631.0 | 642.1 | 8.1 | 441.7 | 0.017 | 0.682 | 0.312 | 618.2 | 98.5 | 48.9 |
| | Phosphor layer | | | | | | | | | | | | | |
| | Nitride phosphor 72-1 | Resin | | | | | | | | | | | | |
| Comparative Example 1 | 40 | 100 | | | 634.7 | 619.8 | 1.1 | 440.9 | 0.012 | 0.669 | 0.322 | 614.1 | 97.6 | 35.8 |
| | Phosphor layer | | | | | | | | | | | | | |
| | Fluoride complex phosphor 71-1 | Nitride phosphor 72-1 | Resin | | | | | | | | | | | |
| Comparative Example 2 | 100 | 80 | 100 | | 631.0 | 616.1 | 2.8 | 439.4 | 0.015 | 0.675 | 0.318 | 616.0 | 97.7 | 36.6 |
| | Phosphor layer | | | | | | | | | | | | | |
| | Fluoride complex phosphor 71-1 | Resin | | | | | | | | | | | | |
| Comparative Example 3 | 150 | 100 | | | 631.0 | 642.8 | 58.6 | 440.2 | 8.1 | 0.468 | 0.184 | — | 82.5 | 64.9 |

The light-emitting device 102 according to Example 1 showed 8.1 of emission intensity ratio at the wavelength of the maximum emission peak in the emission spectrum supposing the reference emission intensity was 1, so that blue light that was emitted from the light source 10 and did not undergo wavelength conversion by the fluoride phosphor 71 contained in the first layer 51 was efficiently subjected to wavelength conversion by the nitride phosphor 72 contained in the second layer 52. Thus red light with a high color purity and a high luminous flux was obtained, whereby the blue light emitted from the light source 10 was substantially prevented from leaking from the light-emitting device 102. The light-emitting device 102 according to Example 1 showed a higher luminous flux than the light-emitting device 105 according to Comparative Example 2 including the phosphor layer 55 containing the fluoride complex phosphor 71-1 and the nitride phosphor 72-1. This is because of that the first layer 51 closer to the light source 10 contained the fluoride complex phosphor 71-1 having a refractive index not much different from the refractive index of the resin of the first layer 51 and a smaller light reflectance than the nitride phosphor contained in the second layer 52. This enabled efficient wavelength conversion of blue light emitted from the light source to enhance the luminous flux, and allowed the nitride phosphor 72-1 contained in the second layer 52 to perform wavelength conversion of blue light that was emitted from the light source and leaked from the first layer 51. Accordingly, the light-emitting device 102 according to Example 1 produced red light with a high color purity and a high luminous flux.

Figure 8:
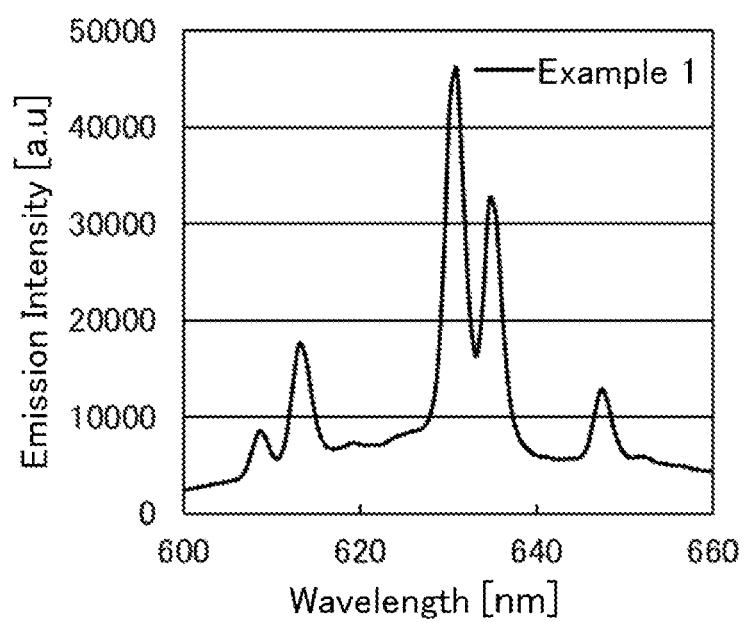
FIG. 8 shows an emission spectrum in the wavelength range of 600 nm or greater and 660 nm or less of a light-emitting device according to Example 1.
Figure 9:
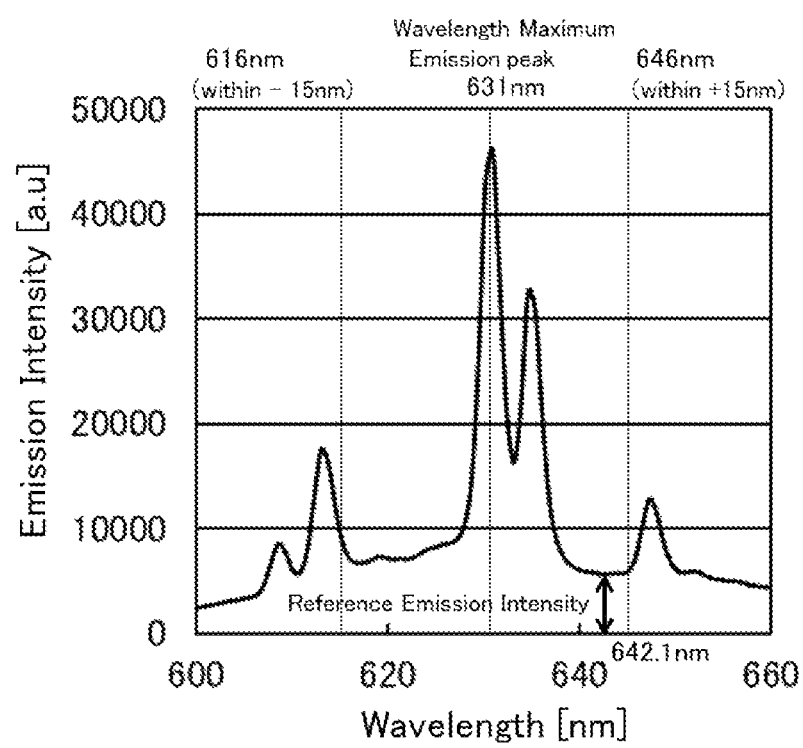
FIG. 9 shows the wavelength of the maximum emission peak and a reference emission intensity in the emission spectrum of the light-emitting device according to Example 1.
Figure 10:
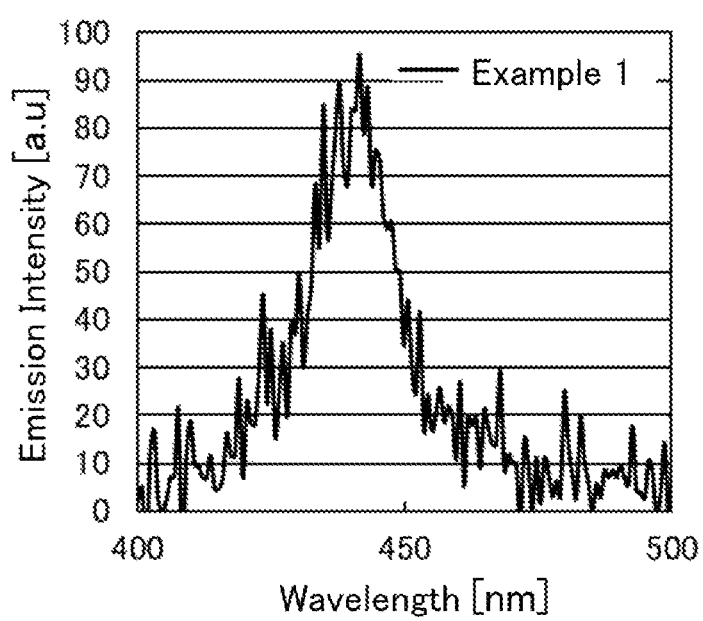
FIG. 10 shows an emission spectrum in the wavelength range of 400 nm or greater and 500 nm or less of the light-emitting device according to Example 1.

FIG. 8 and FIG. 9 show the emission spectrum of the light-emitting device according to Example 1 within the wavelength range of 600 nm or greater and 660 nm or less. FIG. 10 shows the emission spectrum of the light-emitting device according to Example 1 within the wavelength range of 400 nm or greater and 500 nm or less. FIG. 8 and FIG. 9 show the emission spectrum including the maximum emission peak of the light-emitting device according to Example 1 because the emission peak of the light source is small relative to the maximum emission peak in the emission spectrum of the light-emitting device according to Example 1. As shown in FIGS. 8 and 9, in the emission spectrum of the light-emitting device according to Example 1, the wavelength of the maximum emission peak was 631 nm, and the wavelength at which the emission intensity was minimum was 642.1 nm within the range of 15 nm on both of the long wavelength side and the short wavelength side from 631 nm, in other words, the range of 616 nm or greater and 646 nm or less. Supposing the reference emission intensity that was the minimum emission intensity in the range of 616 nm or greater and 646 nm or less was 1, the emission intensity ratio at the wavelength of the maximum emission peak of the light source and the emission intensity ratio at the wavelength of the maximum emission peak of the light-emitting device described above were determined. The emission intensity ratio at the wavelength of the maximum emission peak was 8.1 as described above supposing the reference emission intensity in the emission spectrum of the light-emitting device was 1. FIG. 10 shows an emission spectrum including the maximum emission peak of the light source of the light-emitting device according to Example 1. In the emission spectrum of the light-emitting device, the emission peak wavelength of the light source was 441.7 nm. The emission intensity ratio at the wavelength of the maximum emission peak of the light source was 0.017 supposing the reference emission intensity in the emission spectrum of the light-emitting device was 1.

A light-emitting device 105 according to Comparative Example 2 included the phosphor layer 55 containing the nitride phosphor 72-1 and the fluoride complex phosphor 71-1. The light-emitting device 105 showed a higher luminous flux than that of the light-emitting device 104 of Comparative Example 1 including the phosphor layer 54 containing the nitride phosphor 72-1 and not containing the fluoride complex phosphor 71-1. On the other hand, a light-emitting device 106 according to Comparative Example 3 includes the phosphor layer 56 containing the fluoride complex phosphor 71-1 and not containing the nitride phosphor 72-1. The dominant wavelength of the light-emitting device 106 was not able to be measured, and the light-emitting device did not substantially emit red light because blue light emitted from the light source was not sufficiently absorbed by only the fluoride complex phosphor 71-1.

Example 2

A light-emitting device 102 according to Example 2 was produced in substantially the same manner as Example 1 except that the nitride phosphor 72-2 was used as the nitride phosphor 72 contained in the second layer 52.

Comparative Example 4

A light-emitting device 104 according to Comparative Example 4 was produced in substantially the same manner as Comparative Example 1 except that a resin composition of the phosphor layer containing the nitride phosphor 72-2 was used as the nitride phosphor at a compounding ratio (parts by mass) shown in Table 2.

Comparative Example 5

A light-emitting device 105 according to Comparative Example 5 was produced in substantially the same manner as Comparative Example 2 except that a resin composition of the phosphor layer containing the nitride phosphor 72-2 was used as the nitride phosphor at a compounding ratio (parts by mass) shown in Table 2.

Table 2 shows the results of evaluations of the light-emitting devices according to Example 2 and Comparative Examples 4 and 5. This evaluation results were obtained evaluated by the above-described methods.

TABLE 2

| | Compounding ratio (part by mass) | | | | Wavelength of maximum emission peak (nm) | Wavelength of reference emission intensity (nm) | Emission intensity ratio at wavelength of maximum emission peak | Light source | | Chromaticity | | Dominant wavelength (nm) | Color purity (%) | Luminous flux (lm) |
|---|---|---|---|---|---|---|---|---|---|---|---|---|---|---|
| | | | | | | | | Emission peak wavelength (nm) | Emission intensity ratio at emission peak wavelength | x | y | | | |
| | First layer | | Second layer | | | | | | | | | | | |
| | Fluoride complex phosphor 71-1 | Resin | Nitride phosphor 72-2 | Resin | | | | | | | | | | |
| Example 2 | 150 | 100 | 100 | 100 | 631.0 | 617.6 | 7.6 | 443.2 | 0.014 | 0.686 | 0.308 | 620.5 | 98.2 | 41.8 |
| | Phosphor layer | | | | | | | | | | | | | |
| | Nitride phosphor 72-2 | Resin | | | | | | | | | | | | |
| Comparative Example 4 | 50 | 100 | | | 648.0 | 662.9 | 1.1 | 442.4 | 0.007 | 0.681 | 0.313 | 617.8 | 98.3 | 23.0 |
| | Phosphor layer | | | | | | | | | | | | | |
| | Fluoride complex phosphor 71-1 | Nitride phosphor 72-1 | Resin | | | | | | | | | | | |
| Comparative Example 5 | 100 | 80 | 100 | | 631.0 | 616.8 | 3.5 | 440.9 | 0.011 | 0.683 | 0.311 | 618.9 | 98.3 | 26.4 |

The light-emitting device 102 according to Example 2 showed that an emission intensity ratio at the wavelength of the maximum emission peak was 7.6 and an emission intensity ratio at the wavelength of the maximum emission peak of the light source 10 was 0.014, supposing the reference emission intensity was 1 in the emission spectrum. This result showed that blue light emitted from the light source 10 did not leak from the light-emitting device 102. The color purity was substantially equal to those of Comparative Examples 4 and 5, and the luminous flux was enhanced. The light-emitting device 102 according to Example 2 emitted red light with a high luminous flux because blue light that was emitted from the light source 10 and did not undergo wavelength conversion by the fluoride complex phosphor 71-1 contained in the first layer 51 was efficiently subjected to wavelength conversion by the nitride phosphor 72-2 contained in the second layer 52 and is less likely to be leaked from the light-emitting device 102.

Examples 3 to 7

Light-emitting devices 102 according to Examples 3 to 7 were produced in substantially the same manner as Example 1 except that the fluoride complex phosphor 71-2 was used as the fluoride phosphor contained in the first layer 51 and that the nitride phosphor 72-1 was used as the nitride phosphor contained in the second layer 52 at compounding ratios shown in Table 3.

Table 3 shows the results of evaluations of the light-emitting devices according to Examples 3 to 7. This evaluation results were obtained by the above-described methods.

TABLE 3

| | Compounding ratio (part by mass) | | | | Wavelength of maximum emission peak (nm) | Wavelength of reference emission intensity (nm) | Emission intensity ratio at wavelength of maximum emission peak |
|---|---|---|---|---|---|---|---|
| | First layer | | Second layer | | | | |
| | Fluoride complex phosphor 71-2 | Resin | Nitride phosphor 72-1 | Resin | | | |
| Example 3 | 60 | 100 | 100 | 100 | 631.0 | 616.8 | 3.8 |
| Example 4 | 90 | 100 | 100 | 100 | 631.0 | 644.3 | 5.6 |
| Example 5 | 120 | 100 | 100 | 100 | 631.0 | 642.8 | 7.6 |

TABLE 3-continued

| | | | | | | | |
|---|---|---|---|---|---|---|---|
| Example 6 | 150 | 100 | 100 | 100 | 631.0 | 642.1 | 8.6 |
| Example 7 | 180 | 100 | 100 | 100 | 631.0 | 643.6 | 10.3 |

| | Light source | | | | | |
|---|---|---|---|---|---|---|
| | Emission peak wavelength (nm) | Emission intensity ratio at emission peak wavelength | Chromaticity x | Chromaticity y | Color purity (%) | Luminous flux (lm) |
| Example 3 | 440.9 | 0.056 | 0.666 | 0.309 | 92.7 | 42.8 |
| Example 4 | 442.4 | 0.033 | 0.674 | 0.313 | 96.1 | 47.7 |
| Example 5 | 443.2 | 0.026 | 0.679 | 0.312 | 97.4 | 49.7 |
| Example 6 | 442.4 | 0.031 | 0.678 | 0.312 | 97.0 | 53.3 |
| Example 7 | 440.9 | 0.023 | 0.683 | 0.311 | 97.9 | 54.2 |

In the emission spectra of the light-emitting devices 102 according to Examples 3 to 7, the higher the compounding ratio of the fluoride complex phosphor 71-2 contained in the first layer 51 was, the larger the emission intensity ratio at the wavelength of the maximum emission peak became, and the smaller the emission intensity ratio at the emission peak wavelength of the light source became, supposing the reference emission intensity was 1. Accordingly, the higher the compounding ratio of the fluoride complex phosphor 71-1 contained in the first layer 51 was, the less the leakage of blue light emitted from the light source 10 from the light-emitting device 102, whereby obtained red light can be high in the color purity and luminous flux.

Examples 8 to 12

Light-emitting devices 102 according to Examples 8 to 12 were produced in substantially the same manner as Example 1 except that the fluoride complex phosphor 71-2 was used as the fluoride phosphor 71 contained in the first layer 51 and that the nitride phosphor 72-2 was used as the nitride phosphor 72 contained in the second layer 52 at compounding ratios shown in Table 4.

Table 4 shows the results of evaluations of the light-emitting devices according to Examples 8 to 12. This evaluation results were obtained by the above-described methods.

TABLE 4

| | Compounding ratio (part by mass) | | | | Wavelength of maximum emission peak (nm) | Wavelength of reference emission intensity (nm) | Emission intensity ratio at wavelength of maximum emission peak |
|---|---|---|---|---|---|---|---|
| | First layer | | Second layer | | | | |
| | Fluoride complex phosphor 71-2 | Resin | Nitride phosphor 72-2 | Resin | | | |
| Example 8 | 60 | 100 | 100 | 100 | 631.0 | 616.8 | 4.9 |
| Example 9 | 90 | 100 | 100 | 100 | 631.0 | 616.8 | 6.6 |
| Example 10 | 120 | 100 | 100 | 100 | 631.0 | 617.6 | 7.8 |
| Example 11 | 150 | 100 | 100 | 100 | 631.0 | 642.8 | 9.0 |
| Example 12 | 180 | 100 | 100 | 100 | 631.0 | 642.1 | 10.7 |

| | Light source | | | | | |
|---|---|---|---|---|---|---|
| | Emission peak wavelength (nm) | Emission intensity ratio at emission peak wavelength | Chromaticity x | Chromaticity y | Color purity (%) | Luminous flux (lm) |
| Example 8 | 440.9 | 0.073 | 0.668 | 0.302 | 91.2 | 35.0 |
| Example 9 | 441.7 | 0.046 | 0.677 | 0.306 | 94.9 | 39.6 |
| Example 10 | 440.9 | 0.029 | 0.683 | 0.307 | 96.9 | 43.0 |
| Example 11 | 439.4 | 0.025 | 0.684 | 0.307 | 97.4 | 45.5 |
| Example 12 | 439.4 | 0.024 | 0.685 | 0.307 | 97.6 | 48.0 |

In the emission spectra of the light-emitting devices 102 according to Examples 8 to 12, the higher the compounding ratio of the fluoride complex phosphor 71-2 contained in the first layer 51 was, the larger the emission intensity ratio at the wavelength of the maximum emission peak became, and the smaller the emission intensity ratio at the emission peak wavelength of the light source became, supposing the reference emission intensity was 1. Accordingly, the higher the compounding ratio of the fluoride complex phosphor 71 contained in the first layer 51 was, the less the leakage of blue light emitted from the light source 10 from the light-emitting device 102 was, whereby obtained red light can be high in the color purity and luminous flux.

Example 13

A light-emitting device 102 according to Example 13 was produced in substantially the same manner as Example 1 except that a first resin composition containing the MGF phosphor 71-3 instead of the fluoride complex phosphor 71-1, and the MGF phosphor 71-3 and the nitride phosphor 72-3 were contained at a compounding ratio (parts by mass) shown in Table 5.

Comparative Example 6

A light-emitting device 104 according to Comparative Example 6 was produced in substantially the same manner as Comparative Example 1 except that a resin composition for the phosphor layer containing the nitride phosphor 72-3 having the composition represented as (Ca,Eu)AlSiN$_3$ was contained at a compounding ratio (parts by mass) shown in Table 5.

Table 5 shows the results of evaluations of the light-emitting devices according to Example 13 and Comparative Example 6.

be leaked from the light-emitting device 102. Accordingly, the light-emitting device according to Example 13 can emit red light with a high color purity and with a high luminous flux substantially equal to the luminous flux in Comparative Example 6. As the dominant wavelength of red light emitted from the light-emitting device shifts to the long wavelength side, the wavelength is away from around 555 nm, where human eyes easily focus, and the spectral luminous efficiency decreases, so that the luminous flux tends to decrease. The dominant wavelength of the light-emitting device according to Example 13 was 636.2 nm, which is about 5 nm shifted to longer wavelength side from the dominant wavelength of the light-emitting device 104 according to Comparative Example 6. The light-emitting device according to Example 13 maintaining a luminous flux a little higher than the luminous flux of the light-emitting device according to Comparative Example 6 even in the case in which the dominant wavelength shifted to the long wavelength side, so that red light with a high luminous flux was obtained.

The light-emitting device 104 according to Comparative Example 6 showed an emission intensity ratio at the wavelength of the maximum emission peak of 1.7, which was low, supposing the reference emission intensity was 1 in the emission spectrum, and the luminous flux was a little lower than in Example 13.

Figure 11:
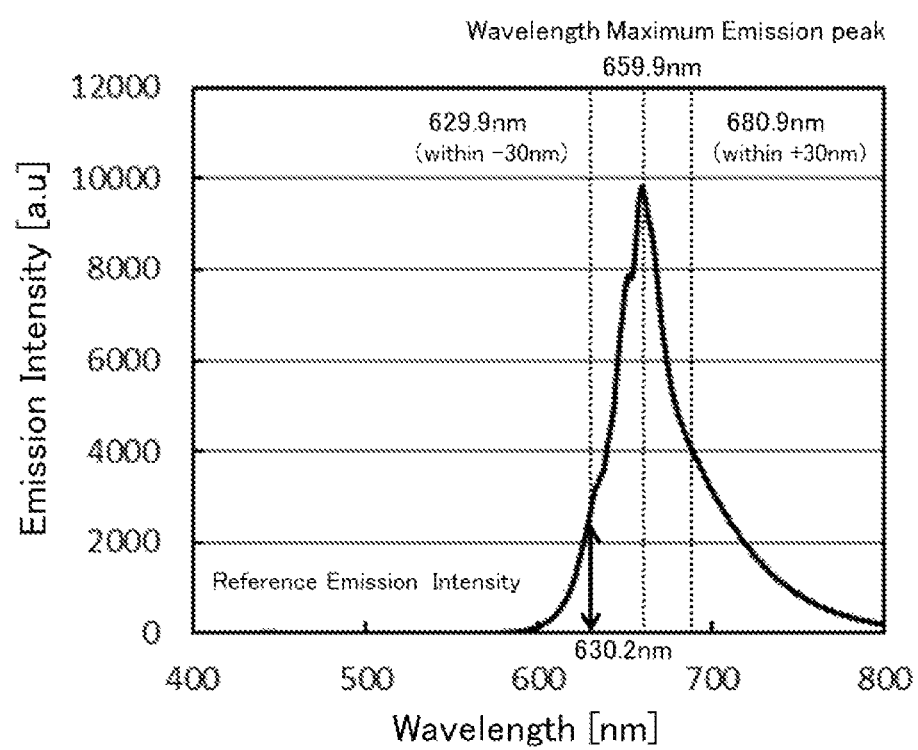
FIG. 11 shows the wavelength of the maximum emission peak and a reference emission intensity in the emission spectrum of a light-emitting device according to Example 13.
Figure 12:
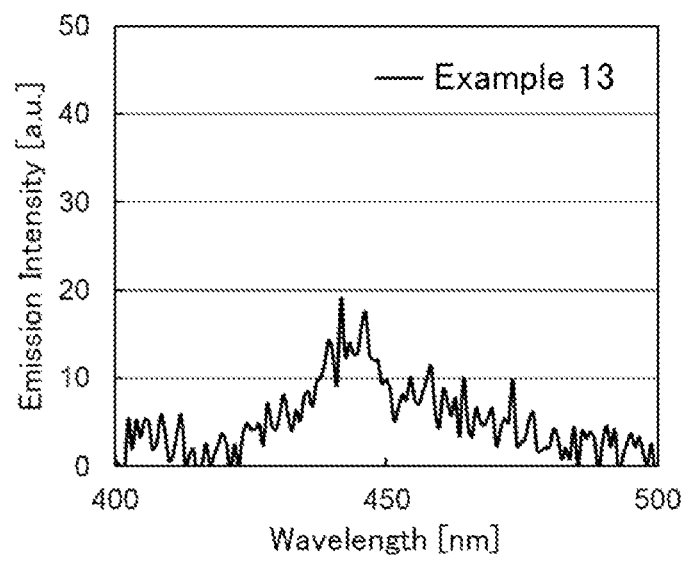
FIG. 12 shows an emission spectrum in the wavelength range of 400 nm or greater and 500 nm or less of the light-emitting device according to Example 13.

FIG. 11 shows the emission spectrum of the light-emitting device according to Example 13 in the wavelength range of 600 nm or greater and 800 nm or less. FIG. 12 shows an emission spectrum in the wavelength range of 400 nm or greater and 500 nm or less of the light-emitting device according to Example 13. FIG. 11 shows the emission spectrum including the maximum emission peak of the light-emitting device according to Example 13 because the emission peak of the light source is small relative to the maximum emission peak in the emission spectrum of the light-emitting device according to Example 13. In the emission spectrum of the light-emitting device according to Example 13 in showed FIG. 12, the wavelength of the maximum emission peak was 659.9 nm, and the wavelength at which the emission intensity was minimum was 630.2 nm

TABLE 5

| | Compounding ratio (part by mass) | | | | Wavelength of maximum emission peak (nm) | Wavelength of reference emission intensity (nm) | Emission intensity ratio at wavelength of maximum emission peak | Light source | | Chromaticity | | Dominant wavelength (nm) | Color purity (%) | Luminous flux (lm) |
|---|---|---|---|---|---|---|---|---|---|---|---|---|---|---|
| | | | | | | | | Emission peak wavelength (nm) | Emission intensity ratio at emission peak wavelength | x | y | | | |
| | First layer | | Second layer | | | | | | | | | | | |
| | MGF phosphor 71-3 | Resin | Nitride phosphor 72-3 | Resin | | | | | | | | | | |
| Example 13 | 150 | 100 | 100 | 100 | 659.9 | 630.2 | 3.6 | 441.7 | 0.007 | 0.710 | 0.285 | 636.4 | 98.4 | 10.5 |
| | Phosphor layer | | | | | | | | | | | | | |
| | Nitride phosphor 72-3 | Resin | | | | | | | | | | | | |
| Comparative Example 6 | 70 | 100 | | | 665.1 | 635.4 | 1.7 | 441.7 | 0.006 | 0.705 | 0.291 | 631.5 | 98.7 | 10.4 |

The light-emitting device 102 according to Example 13 showed an emission intensity ratio at the wavelength of the maximum emission peak of 3.6 in the emission spectrum supposing the reference emission intensity was 1, so that blue light emitted from the light source 10 was less likely to within the range of 30 nm on both of the long wavelength side and the short wavelength side from 659.9 nm, in other words, the range of 629.9 nm or greater and 680.9 nm or less. The emission intensity ratio at the wavelength of the maximum emission peak of the light source and the emission intensity ratio at the wavelength of the maximum emission peak of the light-emitting device described above were determined, supposing the reference emission intensity was 1. The emission intensity ratio at the wavelength of the maximum emission peak was 3.6 as described above, supposing the reference emission intensity in the emission spectrum of the light-emitting device was 1. FIG. 12 shows the emission spectrum including the maximum emission peak of the light source of the light-emitting device according to Example 13. In the emission spectrum of the light-emitting device, the emission peak wavelength of the light source was 443.4 nm. The emission intensity ratio at the wavelength of the maximum emission peak of the light source was 0.007, supposing the reference emission intensity in the emission spectrum of the light-emitting device was 1.

Example 14

A light-emitting device 102 of the embodiment shown in FIG. 2 was manufactured. A light-emitting element formed of a GaN based semiconductor with an emission peak wavelength of 450 nm was used for the light source 10. In the light-emitting device 102, the light-emitting element as the light source 10 was flip-chip mounted on the mounting board 200. A first resin composition containing a silicone resin and a fluoride phosphor 71 that contained the fluoride complex phosphor 71-1 and did not contain the MGF phosphor was prepared. The first resin composition contained 150 parts by mass of the fluoride complex phosphor 71-1 relative to 100 parts by mass of the silicone resin. The first resin composition was dropped so as to be brought into contact with at least a portion of the light source 10, and the first resin composition was cured to form the first layer 51 containing the fluoride phosphor 71. Subsequently, a second resin composition containing a silicone resin and the nitride phosphor 72-4 was prepared. The second resin composition contained 100 parts by mass of the nitride phosphor 72-4 relative to 100 parts by mass of the silicone resin. The second resin composition was dropped on the first layer 51 so as to be brought into contact with at least a portion of the first layer 51, and the second resin composition was cured to form the second layer 52 containing the nitride phosphor 72. The refractive index of the silicone resins was in a range from 1.4 to 1.5. In the resulting light-emitting device 102, the fluoride phosphor 71 was locally disposed close to the light-emitting element 10 in the first layer 51 through centrifugal sedimentation, and a clear layer that substantially did not contain the fluoride phosphor 71 or the nitride phosphor 72 was formed between the first layer 51 and the second layer 52. On the cross section of the resulting light-emitting device 102, the thickness Te of the light-emitting element 10 was 134 μm, and along the line extending in the direction perpendicular to the first surface 10a of the light-emitting element 10 in the first surface 10a of the light-emitting element 10, the thickness T1 of the first layer 51 was 76 μm, and the thickness T2 of the second layer 52 was 226 μm, measured by the method described later. The clear layer formed between the first layer 51 and the second layer 52 was included in the first layer 51, and the thickness of the clear layer alone was not able to measure individually.

Example 15

A light-emitting device 103 of the embodiment shown in FIG. 3 was manufactured. The same light-emitting element as in Example 14 was used for the light source 10. In the light-emitting device 103, the light-emitting element as the light source 10 was flip-chip mounted on the mounting board 200. A first resin composition containing a silicone resin and a fluoride phosphor 71 that contained the fluoride complex phosphor 71-1 and did not contain the MGF phosphor was prepared. The first resin composition contained 150 parts by mass of the fluoride complex phosphor 71-1 relative to 100 parts by mass of the silicone resin. A second resin composition containing a silicone resin and the nitride phosphor 72-2 was prepared. The second resin composition contained 35 parts by mass of the nitride phosphor 72-2 and 35 parts by mass of the nitride phosphor 72-4 relative to 100 parts by mass of the silicone resin. For controlling the chromaticity of light emitted from the light-emitting device 103, two types of the nitride phosphor 72-2 and the nitride phosphor 72-4 having different compositions of the phosphor were used as the nitride phosphor 72 contained in the second resin composition. The first resin composition was dropped so as to be brought into contact with at least a portion of the light source 10, and the first resin composition was cured to form the first layer 51 containing the fluoride phosphor 71. Subsequently, the second resin composition was dropped on the first layer 51 so as to be brought into contact with at least a portion of the first layer 51, and the second resin composition was cured to form the second layer 52 containing the nitride phosphor 72. The resulting light-emitting device 103 included the first layer 51 containing the fluoride phosphor 71, the intermediate region 53 containing the fluoride phosphor 71 and the nitride phosphor 72 mixed, and the second layer 52 containing the nitride phosphor 72. The first layer 51, the intermediate region 53, and the second layer 52 were formed continuously without the interface between the layers or the region. In the cross section of the resulting light-emitting device 103, the thickness Te of the light-emitting element 10 was 137 μm, and along the line extending in the direction perpendicular to the first surface 10a of the light-emitting element 10 in the first surface 10a of the light-emitting element 10, the total thickness T1+T2 of the first layer 51, the second layer 52, and the intermediate region 53 was 301 μm, measured by the method described later. In the resulting light-emitting device 103, the thickness T1 of the first layer 51 and the thickness T2 of the second layer 52 were not able to measure individually because the first layer 51, the intermediate region 53, and the second layer 52 were continuously formed without the interface.

Thickness of Light-emitting Element, First Layer, Second Layer, and Intermediate Region The cross-sectional SEM images of the light-emitting devices according to Examples 14 and 15 were obtained using a scanning electron microscope (SEM). On the cross-sectional SEM image, the thickness between the first surface 10a and the second surface 10b as the other surface opposite thereto of the light source 10 placed on the mounting board 200 was measured as the thickness Te of the light-emitting element 10. The total thickness T1+T2 of the first layer 51 and the second layer 52 was measured along the line extending in the direction perpendicular to the first surface 10a of the light-emitting element 10 in the first surface 10a of the light-emitting element 10.

Table 6 shows the results of evaluations of the light-emitting devices according to Examples 14 and 15.

TABLE 6

| | Compounding ratio (part by mass) | | | | | Wavelength of maximum emission peak (nm) | Wavelength of reference emission intensity (nm) | Emission intensity ratio at wavelength of maximum emission peak |
|---|---|---|---|---|---|---|---|---|
| | First layer | | Second layer | | | | | |
| | Fluoride complex phosphor 71-1 | Resin | Nitride phosphor 72-4 | Nitride phosphor 72-2 | Resin | | | |
| Example 14 | 150 | 100 | 100 | — | 100 | 631.0 | 643.6 | 7.4 |
| Example 15 | 150 | 35 | 35 | 35 | 100 | 631.0 | 642.8 | 7.8 |

| | Light source | | Chromaticity | | Dominant wavelength (lm) | Color purity (%) | Luminous flux (lm) |
|---|---|---|---|---|---|---|---|
| | Emission peak wavelength (nm) | Emission intensity ratio at emission peak wavelength | x | y | | | |
| Example 14 | 450.7 | 0.0103 | 0.684 | 0.311 | 618.7 | 98.7 | 49.3 |
| Example 15 | 445.4 | 0.0102 | 0.684 | 0.312 | 618.5 | 98.8 | 49.8 |

In the emission spectra of the light-emitting device 102 according to Example 14 and the light-emitting device 103 according to Example 15, supposing the reference emission intensity was 1, the emission intensity ratios at the wavelength of the maximum emission peak were 7.4 and 7.8, and red light with a high color purity and a high luminous flux was obtained substantially without allowing blue light emitted from the light source 10 to leak from the light-emitting device 102 or 103.

Evaluation of Reliability (Relative Luminous Flux after Continuous Lighting)

Figure 13:
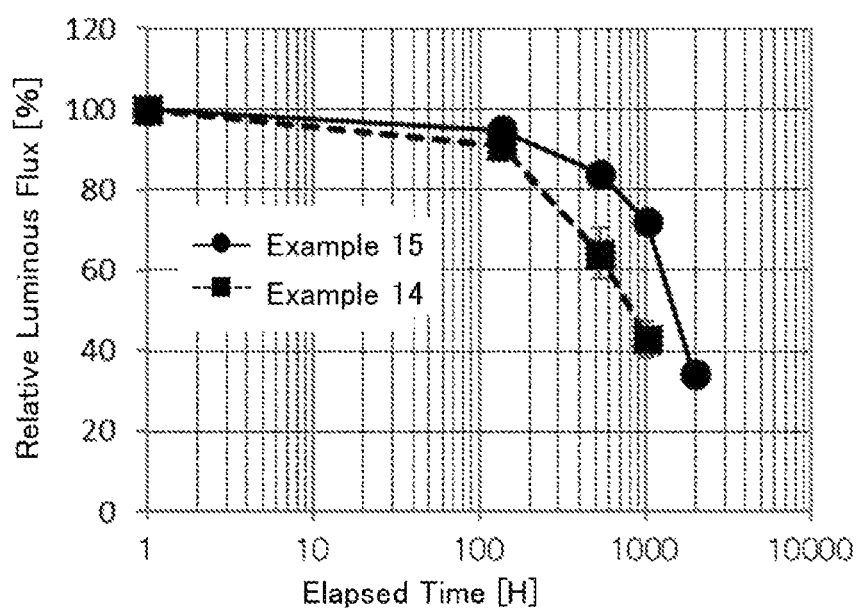
FIG. 13 is a graph illustrating the relative luminous flux from the initial stage to after continuous lighting of the light-emitting devices according to Examples 14 and 15.

The light-emitting devices according to Examples 14 and 15 were placed in a high-temperature chamber at a temperature of 85° C. and a humidity of 85% and subjected to continuous lighting at 350 mA, and the luminous flux was measured every elapsed time with a total luminous flux measurement apparatus employing an integrating sphere. Supposing the initial luminous flux of the light-emitting device lighted at 350 mA before placement in the high-temperature chamber was 100%, the luminous fluxes from the initial stage to after the continuous lighting were expressed as relative values. The relative value of the luminous flux of the light emitting device after elapse of 1018 hours with respect to 100% of the initial luminous flux of the light emitting device was calculated as the luminous flux maintenance. FIG. 13 shows the results.

The light-emitting device according to Example 14 showed a luminous flux maintenance of 42.8%, and the light-emitting device according to Example 15 showed a luminous flux maintenance of 72.0%. In the light-emitting device according to Example 15, the intermediate region containing the fluoride complex phosphor 71-1, the nitride phosphor 72-4, and the nitride phosphor 72-2 mixed was formed between the first layer and the second layer. The first layer, the intermediate region, and the second layer were formed continuously without the interface. This is considered to be a reason why heat generated from the light source easily dissipated to the outside to achieve good heat dissipation performance, and the luminous flux maintenance was improved, as shown by the luminous flux maintenance and FIG. 13. The light-emitting device according to Example 15 included the intermediate region containing the fluoride complex phosphor 71-1, the nitride phosphor 72-4, and the nitride phosphor 72-2 mixed between the first layer and the second layer, and therefore the durability of the light-emitting device was improved, and the luminous flux maintenance was improved even in the case of continuous lighting at high temperature. In the light-emitting device according to Example 14, the clear layer that did not substantially contain the phosphor was formed between the first layer and the second layer, and therefore the luminous flux maintenance was lower than that of the light-emitting device according to Example 15 having the intermediate region between the first layer and the second layer.

The light-emitting device of the present disclosure can be suitably used for signals, illuminated switches, various sensors, various indicators, small strobes, and the like.

What is claimed is:

1. A red light-emitting device comprising:
   a light source;
   a first layer covering at least a portion of the light source and comprising a fluoride phosphor for wavelength conversion of light emitted from the light source, the fluoride phosphor comprising at least one of a manganese-activated fluoride complex phosphor and a manganese-activated fluorogermanate phosphor; and
   a second layer covering at least a portion of the first layer and comprising a nitride phosphor for wavelength conversion of light emitted from the light source and/or the first layer,
   wherein,
   in a case in which the manganese-activated fluoride complex phosphor is contained and the manganese-activated fluorogermanate phosphor is not contained, a first reference emission intensity is regarded as a minimum emission intensity in a range of 15 nm on both of a long wavelength side and a short wavelength side from a first center that is a wavelength of a first maximum emission peak in an emission spectrum of the light-emitting device, in a case in which the manganese-activated fluorogermanate phosphor is comprised, a second reference emission intensity is regarded as a minimum emission intensity in a range of 30 nm on both of the long wavelength side and the short wavelength side from a second center that is a wavelength of a second maximum emission peak in the emission spectrum of the light-emitting device, and supposing both the first reference emission intensity and the second reference emission intensity are 1, an emission intensity ratio at an emission peak wavelength of the light source is greater than 0 and 0.1 or less, and an emission intensity ratio at the wavelength of the first maximum emission peak and/or an emission intensity ratio at the wavelength of the second maximum emission peak in the emission spectrum of the light-emitting device is 3.0 or greater and 12.0 or less, wherein the manganese-activated fluoride complex phosphor has a composition represented by Formula (I) below:

$$A_2[M^a{}_{1-a}Mn^{4+}{}_aF_6] \tag{I},$$

wherein A is at least one ion selected from the group consisting of alkali-metal ions and $NH_4^+$, wherein $M^a$ is at least one element selected from the group consisting of group IV elements and group XIV elements, and wherein "a" satisfies 0<a<0.2, wherein the manganese-activated fluorogermanate phosphor has a composition represented by any one of Formulae (II-I) and (II-II) below:

$$3.5MgO \cdot 0.5MgF_2 \cdot GeO_2:Mn \tag{II-I}$$

$$(i-j)MgO \cdot (j/2)M^b{}_2O_3 \cdot kMgF_2 \cdot mCaF_2 \cdot (1-n)GeO_2 \cdot (n/2)M^c{}_2O_3:zMn^{4+} \tag{II-II}$$

wherein $M^b$ is at least one element selected from the group consisting of Sc, Y, La, Ce, Pr, Nd, Pm, Sm, Eu, Gd, Tb, Dy, Ho, Er, Tm, Yb, and Lu, wherein MC is at least one element selected from the group consisting of Al, Ga, and In, and wherein i, j, k, m, n, and z are numbers respectively satisfying 2≤i≤4, 0≤j<0.5, 0<k<1.5, 0≤m<1.5, 0<n<0.5, and 0<z<0.05, wherein the nitride phosphor has a composition represented by Formula (III) below:

$$(Ca_{1-s-t}Sr_sEu_t)_xAl_uSi_vN_w \tag{III}$$

wherein s, t, u, v, w, and x are numbers respectively satisfying 0≤s<1, 0<t<1.0, 0<s+t<1.0, 0.8≤x≤1.0, 0.8≤u≤1.2, 0.8≤v≤1.2, 1.9≤u+v≤2.1, and 2.5≤w≤3.5, wherein the first layer contains a resin or glass, and an amount of the fluoride phosphor in the first layer is in a range of 20 parts by mass or greater and 200 parts by mass or less relative to 100 parts by mass of the resin or glass in the first layer, and wherein the second layer contains a resin or glass, and an amount of the nitride phosphor in the second layer is in a range of 20 parts by mass or greater and 200 parts by mass or less relative to 100 parts by mass of the resin or glass in the second layer.

2. The light-emitting device according to claim 1, wherein the light source has an emission peak wavelength in a range of 400 nm or greater and 480 nm or less.

3. The light-emitting device according to claim 1, wherein the light source comprises a GaN based semiconductor light-emitting element.

4. The light-emitting device according to claim 3, wherein a total thickness of the first layer and the second layer is larger than a thickness of the light-emitting element.

5. The light-emitting device according to claim 1, wherein the resin comprises at least one selected from the group consisting of a silicone resin, a modified silicone resin, an epoxy resin, and a modified epoxy resin.

6. The light-emitting device according to claim 1,
wherein the second layer is continuously disposed with the first layer, and
wherein a region between the first layer and the second layer is configured as an intermediate region comprising the fluoride phosphor, the nitride phosphor, and a resin or glass.

7. The light-emitting device according to claim 1, wherein the second layer is in contact with at least a portion of the first layer, the light-emitting device further comprising a light-transmissive body on a surface of the second layer opposite to a surface in contact with the first layer.

8. The light-emitting device according to claim 7, wherein the light-transmissive body comprises a glass material.

9. The light-emitting device according to claim 1, further comprising a reflective member in contact with a portion of the light source and a portion of the first layer or a portion of the second layer.

10. The light-emitting device according to claim 1, wherein a thickness of the first layer in a range of 1.1 times or greater and 5 times or less when a thickness of the second layer is 1.

11. The light-emitting device according to claim 10,
wherein the second layer is continuously disposed with the first layer, and
wherein a region between the first layer and the second layer is configured as an intermediate region comprising the fluoride phosphor, the nitride phosphor, and a resin or glass.

12. The light-emitting device according to claim 10, wherein the second layer is in contact with at least a portion of the first layer, the light-emitting device further comprising a light-transmissive body on a surface of the second layer opposite to a surface in contact with the first layer.

13. The light-emitting device according to claim 10, further comprising a reflective member in contact with a portion of the light source and a portion of the first layer or a portion of the second layer.

14. The light-emitting device according to claim 10, wherein a total thickness of the first layer and the second layer is larger than a thickness of the light-emitting element.

15. The light-emitting device according to claim 1, wherein a thickness of the first layer in a range of 0.1 times or greater and 1 times or less when a thickness of the second layer is 1.

16. The light-emitting device according to claim 15,
wherein the second layer is continuously disposed with the first layer, and
wherein a region between the first layer and the second layer is configured as an intermediate region comprising the fluoride phosphor, the nitride phosphor, and a resin or glass.

17. The light-emitting device according to claim 15, wherein the second layer is in contact with at least a portion of the first layer, the light-emitting device further comprising a light-transmissive body on a surface of the second layer opposite to a surface in contact with the first layer.

18. The light-emitting device according to claim 15, further comprising a reflective member in contact with a portion of the light source and a portion of the first layer or a portion of the second layer.

19. The light-emitting device according to claim 15, wherein a total thickness of the first layer and the second layer is larger than a thickness of the light-emitting element.

\* \* \* \* \*